(12) United States Patent
Kim et al.

(10) Patent No.: US 12,424,545 B2
(45) Date of Patent: Sep. 23, 2025

(54) THREE-DIMENSIONAL MEMORY DEVICE

(71) Applicant: SK hynix Inc., Icheon-si (KR)

(72) Inventors: Jin Ho Kim, Icheon-si (KR); Chang Woo Kang, Icheon-si (KR); Sang Hyun Sung, Icheon-si (KR); Chang Man Son, Icheon-si (KR); Sung Lae Oh, Icheon-si (KR)

(73) Assignee: SK hynix Inc., Icheon-si (JP)

( * ) Notice: Subject to any disclaimer, the term of this patent is extended or adjusted under 35 U.S.C. 154(b) by 616 days.

(21) Appl. No.: 17/843,930

(22) Filed: Jun. 17, 2022

(65) Prior Publication Data
US 2023/0238322 A1 Jul. 27, 2023

(30) Foreign Application Priority Data

Jan. 21, 2022 (KR) ........................ 10-2022-0009522

(51) Int. Cl.
| | |
|---|---|
| *H10B 41/27* | (2023.01) |
| *H01L 23/528* | (2006.01) |
| *H01L 23/535* | (2006.01) |
| *H10B 41/41* | (2023.01) |
| *H10B 43/27* | (2023.01) |
| *H10B 43/40* | (2023.01) |

(52) U.S. Cl.
CPC ........ *H01L 23/5283* (2013.01); *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC ........ H10B 41/27; H10B 43/27; H10B 41/10; H10B 43/10; H10B 51/10; H10B 53/10; H10B 41/20; H10B 43/20; H10B 51/20; H10B 41/50; H10B 43/50; H10B 51/50; H10B 53/50
See application file for complete search history.

(56) References Cited

U.S. PATENT DOCUMENTS

| | | | |
|---|---|---|---|
| 10,685,980 B2 | 6/2020 | Kim et al. | |
| 10,903,229 B2 | 1/2021 | Baek et al. | |
| 2012/0168850 A1* | 7/2012 | Lee | ........................ H10B 43/20 257/E21.41 |
| 2020/0020714 A1* | 1/2020 | Oh | ........................ H10B 43/27 |

FOREIGN PATENT DOCUMENTS

KR 10-2020-0057936 A 5/2020

\* cited by examiner

*Primary Examiner* — Moazzam Hossain

(57) ABSTRACT

A three-dimensional memory device includes a first electrode structure and a second electrode structure extending in a first direction, being adjacent to each other in a second direction intersecting with the first direction, and each including a plurality of electrode layers and a plurality of interlayer dielectric layers which are alternately stacked on a source plate; a plurality of first slimming holes formed in the first electrode structure to expose pad regions of the electrode layers of the first electrode structure, and arranged in the first direction; and a plurality of second slimming holes formed in the second electrode structure to expose pad regions of the electrode layers of the second electrode structure, and arranged in the first direction, wherein a first slimming hole and a second slimming hole which are adjacent in the second direction have different depths.

18 Claims, 21 Drawing Sheets

FIG.13

| GRL | BLK1-RL | BLK2-RL |
|-----|---------|---------|
| 0 | 0 | 6 |
| 1 | 1 | 7 |
| 2 | 2 | 8 |
| 3 | 3 | 9 |
| 4 | 4 | 11 |
| 5 | 5 | 10 |
| 6 | 6 | 0 |
| 7 | 7 | 1 |
| 8 | 8 | 2 |
| 9 | 9 | 3 |
| 11 | 11 | 4 |
| 10 | 10 | 5 |

THREE-DIMENSIONAL MEMORY DEVICE

CROSS-REFERENCE TO RELATED APPLICATION

The present application claims priority under 35 U.S.C. § 119(a) to Korean Patent Application No. 10-2022-0009522, filed in the Korean Intellectual Property Office on Jan. 21, 2022, which is incorporated herein by reference in its entirety.

BACKGROUND

1. Technical Field

Various embodiments generally relate to a semiconductor technology, and more particularly, to a three-dimensional memory device.

2. Related Art

A memory device with a two-dimensional or planar structure has been developed to store more data in the same area by using a fine patterning process. However, as the line width of a circuit is narrowed due to the demand for high integration, interference between memory cells becomes severe, thereby causing various limitations such as degradation in performance. Of course, in addition to such structural limitations, there is a problem in that an increase in manufacturing cost is inevitable because the introduction of expensive equipment is required to pattern a fine line width.

As an alternative, to overcome limitations of the two-dimensional memory device, a three-dimensional memory device has been proposed. A three-dimensional memory device has advantages in that a larger capacity may be realized within the same area by increasing the number of stacks through stacking memory cells in a vertical direction, thereby providing high performance and excellent power efficiency.

In the three-dimensional memory device, in order to independently apply electrical signals to the electrode layers disposed at different heights, contacts should be coupled to the respective electrode layers, and various technologies for this end are being developed.

SUMMARY

Various embodiments are directed to a three-dimensional memory device capable of reducing the size of a memory block.

In an embodiment, a three-dimensional memory device may include: a first electrode structure and a second electrode structure, each extending in a first direction and being adjacent to each other in a second direction intersecting with the first direction, and each including a plurality of electrode layers and a plurality of interlayer dielectric layers that are alternately stacked on a source plate; a plurality of first slimming holes arranged in the first direction and formed in the first electrode structure to expose pad regions of the electrode layers of the first electrode structure; and a plurality of second slimming holes arranged in the first direction and formed in the second electrode structure to expose pad regions of the electrode layers of the second electrode structure, wherein a first slimming hole and a second slimming hole that are adjacent in the second direction have different depths.

In an embodiment, a three-dimensional memory device may include: a first electrode structure and a second electrode structure adjacent to each other in a second direction intersecting with a first direction, each including a plurality of electrode layers and a plurality of interlayer dielectric layers that are alternately stacked on a source plate; a first slimming hole formed in the first electrode structure; and a second slimming hole formed in the second electrode structure to be adjacent to the first slimming hole in the second direction and to have a depth different from that of the first slimming hole.

BRIEF DESCRIPTION OF THE DRAWINGS

FIG. 13 is a mapping table showing a coupling relationship between the global row lines of FIG. 12 and row lines of first and second memory blocks.

DETAILED DESCRIPTION

Figure 1:
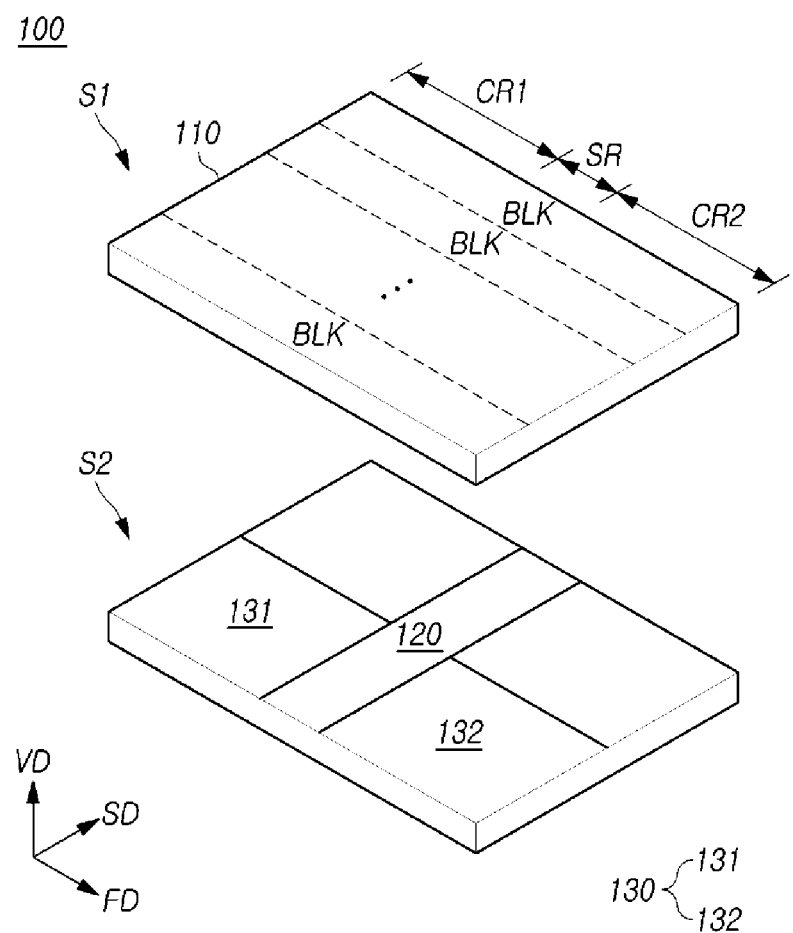
FIG. 1 is a view schematically illustrating a three-dimensional memory device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinbelow, a direction vertically projecting from the top surface of a substrate or a source plate is defined as a vertical direction VD, and two directions parallel to the top surface of the substrate or the source plate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other.

Hereinafter, various examples of embodiments of the present disclosure will be described in detail with reference to the accompanying drawings.

FIG. 1 is a view schematically illustrating a three-dimensional memory device in accordance with an embodiment of the present disclosure.

Referring to FIG. 1, a three-dimensional memory device 100 in accordance with an embodiment of the present disclosure may include a first semiconductor layer S1 and a second semiconductor layer S2, which is disposed under the first semiconductor layer S1. For better understanding, FIG. 1 illustrates that the first semiconductor layer S1 and the second semiconductor layer S2 are separated from each other. However, it is to be understood that the bottom surface of the first semiconductor layer S1 and the top surface of the second semiconductor layer S2 are in contact with each other.

The first semiconductor layer S1 may include a slimming region SR as well as a first cell region CR1 and a second cell region CR2 that are disposed on both sides of the slimming region SR in the first direction FD. A memory cell array 110 may be disposed in the first and second cell regions CR1 and CR2 and the slimming region SR of the first semiconductor layer S1.

The memory cell array 110 may include a plurality of memory blocks BLK. A memory block BLK may include a plurality of row lines and a plurality of memory cells that are coupled to the plurality of row lines. The plurality of row lines may be stacked in the vertical direction VD in the first and second cell regions CR1 and CR2 and the slimming region SR. The plurality of row lines may include at least one source select line, a plurality of word lines and at least one drain select line. The plurality of memory cells may be disposed in the first cell region CR1 and the second cell region CR2.

Embodiments to be described below with reference to the drawings illustrate memory cells that are nonvolatile memory cells and a three-dimensional memory device that is a flash memory, but embodiments contemplated by the disclosure are not limited thereto. For example, the memory cell may be a volatile memory cell that loses data stored therein when power supply is cut off, or may be a nonvolatile memory cell that retains data stored therein even when power supply is cut off. When the memory cell is a volatile memory cell, the three-dimensional memory device 100 may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cell is a nonvolatile memory cell, the three-dimensional memory device 100 may be an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The three-dimensional memory device 100 may be a hybrid memory which includes both volatile memory cells and nonvolatile memory cells.

The memory cell may be a single level cell (SLC) that stores one-bit data or a multi-level cell (MLC) that stores two or more-bit data. The multi-level cell may store two-bit data, three-bit data, four-bit data, and so forth. The memory cell array 110 may include at least one of single level cells and multi-level cells.

Although not illustrated, the memory block BLK may include a plurality of pages. The memory block BLK may be a basic unit of an erase operation, and the page may be a basic unit of a read operation.

The second semiconductor layer S2 may include a row decoder 120, a page buffer circuit 130, and a peripheral circuit (not illustrated). The row decoder 120 may be configured to have a shape extending in the second direction SD, which is a direction in which the row lines are arranged. The row decoder 120 may include a plurality of pass transistors. The row decoder 120 may be configured to overlap the slimming region SR of the first semiconductor layer S1 in the vertical direction VD. In this case, the three-dimensional memory device 100 may be defined as having a PUS (pass transistor under slim) structure.

The row decoder 120 may be coupled in common to the first cell region CR1 and the second cell region CR2. The first cell region CR1 and the second cell region CR2 may share the row decoder 120. Since the first cell region CR1 and the second cell region CR2 share row decoder 120, the size of the three-dimensional memory device 100 may be reduced when compared to a device in which each of the first cell region CR1 and the second cell region CR2 uses a different row decoder.

The page buffer circuit 130 may be divided into a first page buffer region 131 and a second page buffer region 132, which are disposed on both sides of the row decoder 120 in the first direction FD.

The first page buffer region 131 may be configured to overlap the first cell region CR1 in the vertical direction VD and have substantially the same length as the first cell region CR1 in the first direction FD, which is the direction in which bit lines are arranged. The second page buffer region 132 may be configured to overlap the second cell region CR2 in the vertical direction VD and have substantially the same length as the second cell region CR2 in the first direction FD.

Each of the first page buffer region 131 and the second page buffer region 132 may include a plurality of page buffers. A page buffer may receive a page buffer control signal from the peripheral circuit, and may transmit and receive a data signal to and from the peripheral circuit. The page buffer may control the bit line coupled to memory cells, in response to the page buffer control signal. For example, the page buffer may detect data, stored in a memory cell, by sensing a signal of the bit line in response to the page buffer control signal, and may transmit the data signal to the peripheral circuit according to the detected data. Depending on a data signal received from the peripheral circuit, the page buffer may apply a signal to the bit line in response to the page buffer control signal, and thereby, may write data to a memory cell. The page buffer may write data to or read data from a memory cell that is coupled to a word line activated by the row decoder 120.

The first semiconductor layer S1 and the second semiconductor layer S2 may be fabricated in a monolithic manner. The term monolithic means that the first semiconductor layer S1 and the second semiconductor layer S2 are fabricated on a single wafer. In this case, the three-dimensional memory device 100 may be defined as having a PUC (peripheral under cell) structure. The first semiconductor layer S1 and the second semiconductor layer S2, however, also may be fabricated in a non-monolithic manner. That is to say, the first semiconductor layer S1 and the second semiconductor layer S2 may be fabricated on different wafers, and then coupled by a bonding technique. In this case, the three-dimensional memory device 100 may be defined as having a POC (peripheral over cell) structure. The three-dimensional memory device 100 in accordance with embodiments of the present disclosure may be provided as the PUC structure or the POC structure.

Figure 2:
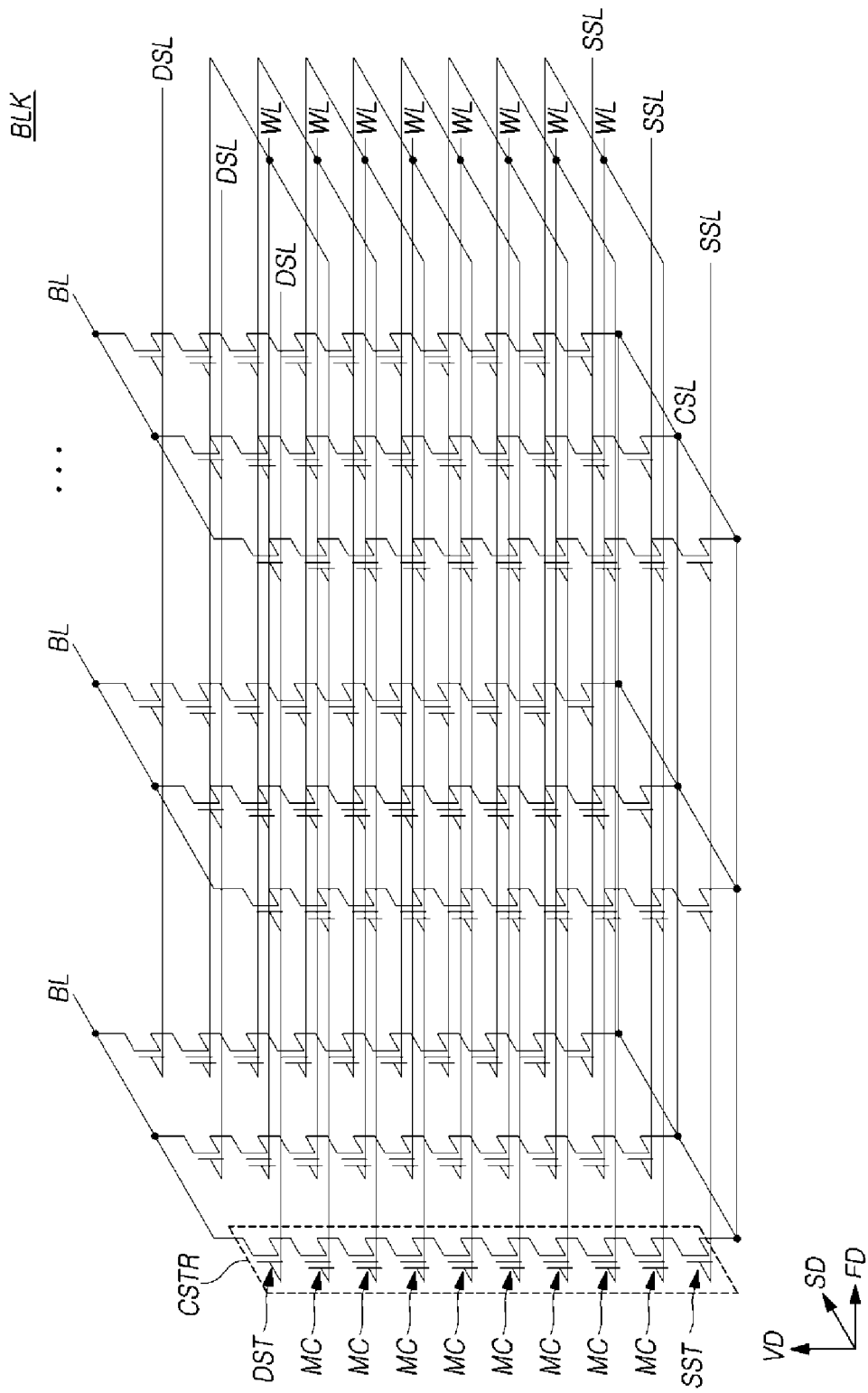
FIG. 2 is an equivalent circuit diagram of one of the memory blocks illustrated in FIG. 1.

FIG. 2 is an equivalent circuit diagram of one of the memory blocks illustrated in FIG. 1.

Referring to FIG. 2, a memory block BLK may include a plurality of cell strings CSTR, which are coupled between a plurality of bit lines BL and a common source line CSL.

A plurality of cell strings CSTR may be coupled in parallel to each bit line BL. The cell strings CSTR may be coupled in common to the common source line CSL. The plurality of cell strings CSTR may be coupled between the plurality of bit lines BL and the one common source line CSL.

Each cell string CSTR may include a drain select transistor DST that is coupled to the bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in the vertical direction VD.

At least one drain select line DSL, a plurality of word lines WL and at least one source select line SSL may be disposed between the bit lines BL and the common source line CSL in the vertical direction VD. The drain select line DSL may be coupled to the gates of corresponding drain select transistors DST. The word line WL may be coupled to the gates of corresponding memory cells MC. The source select line SSL may be coupled to the gates of corresponding source select transistors SST. Memory cells MC that are coupled in common to one word line WL may configure one page.

Figure 3:
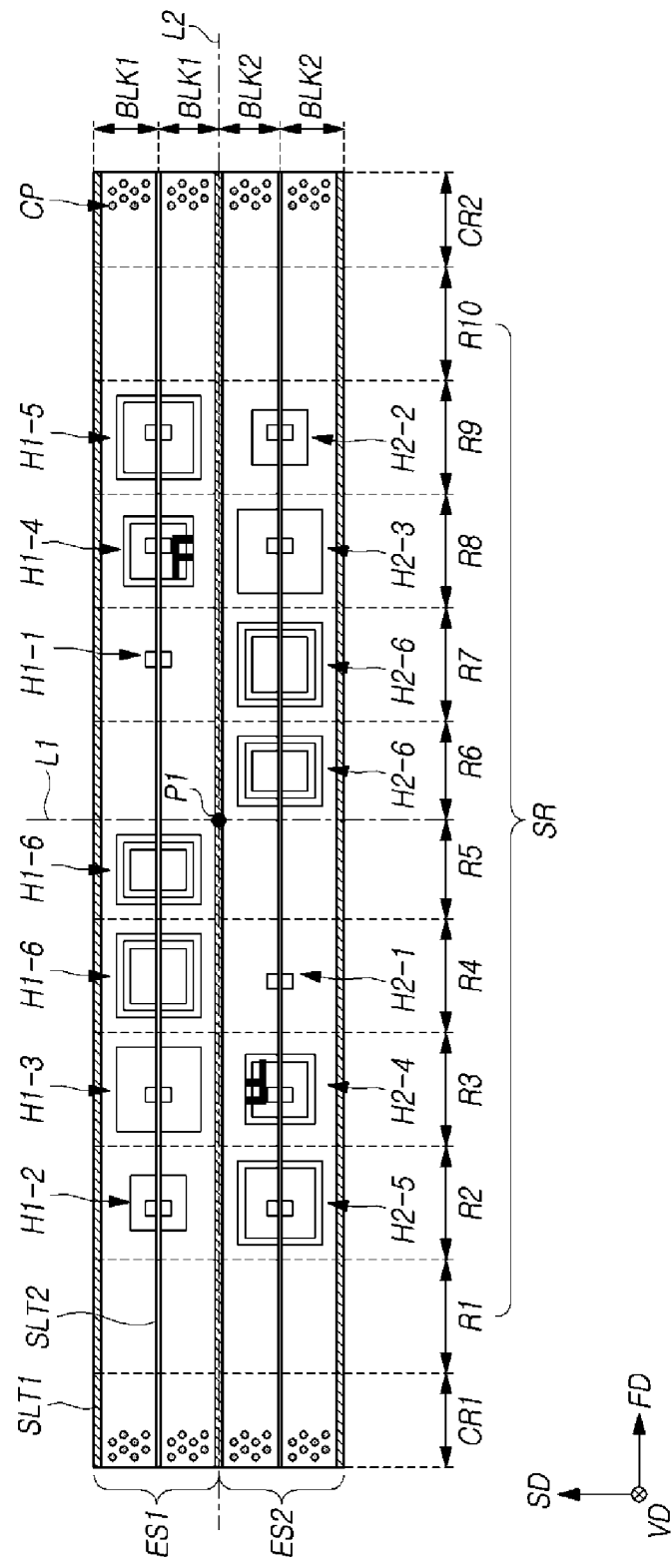
FIG. 3 is a top view illustrating a part of a three-dimensional memory device in accordance with an embodiment of the present disclosure.
Figure 4:
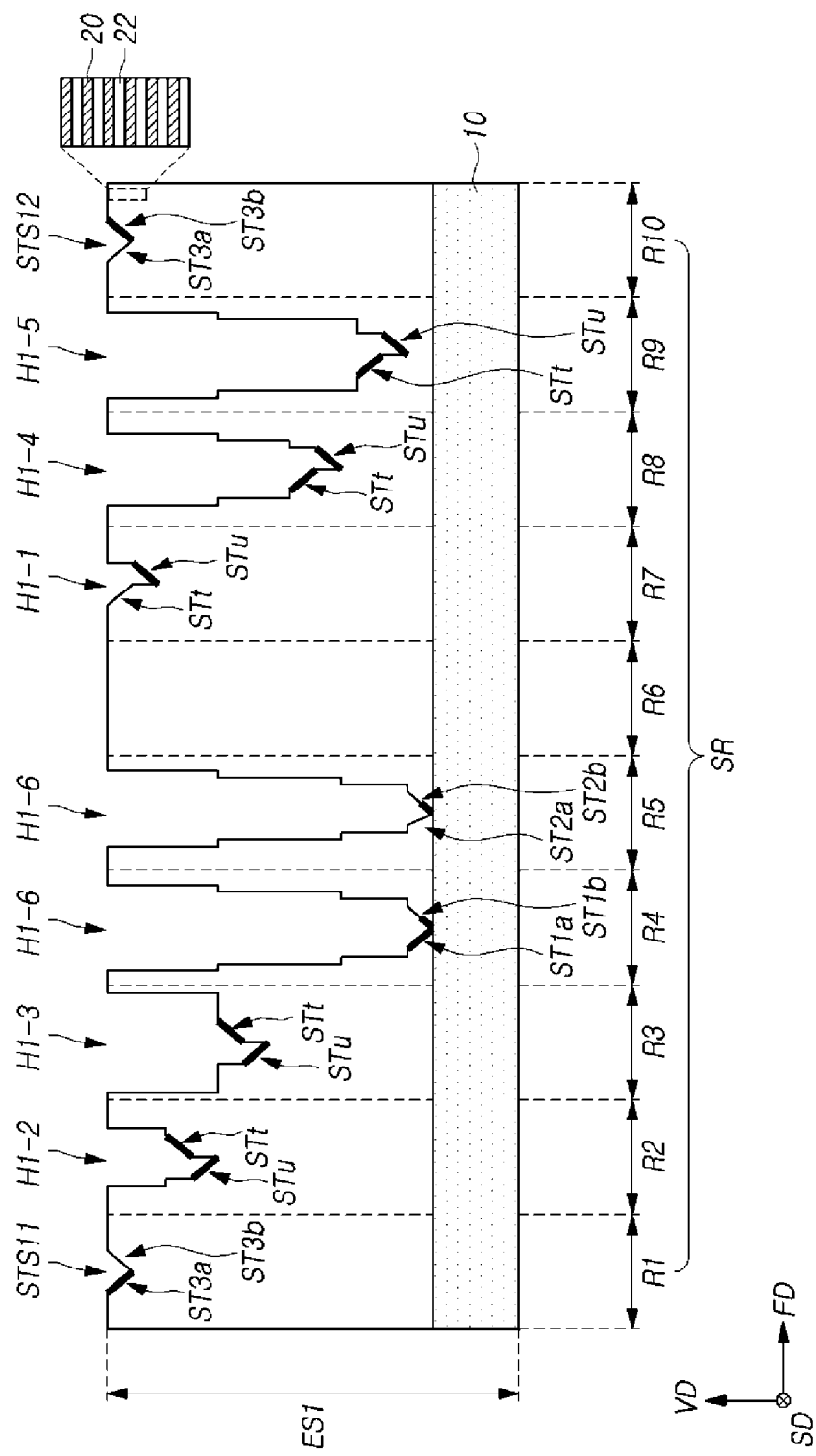
FIG. 4 is a cross-sectional view of a first electrode structure of FIG. 3 taken in a first direction.
Figure 5:
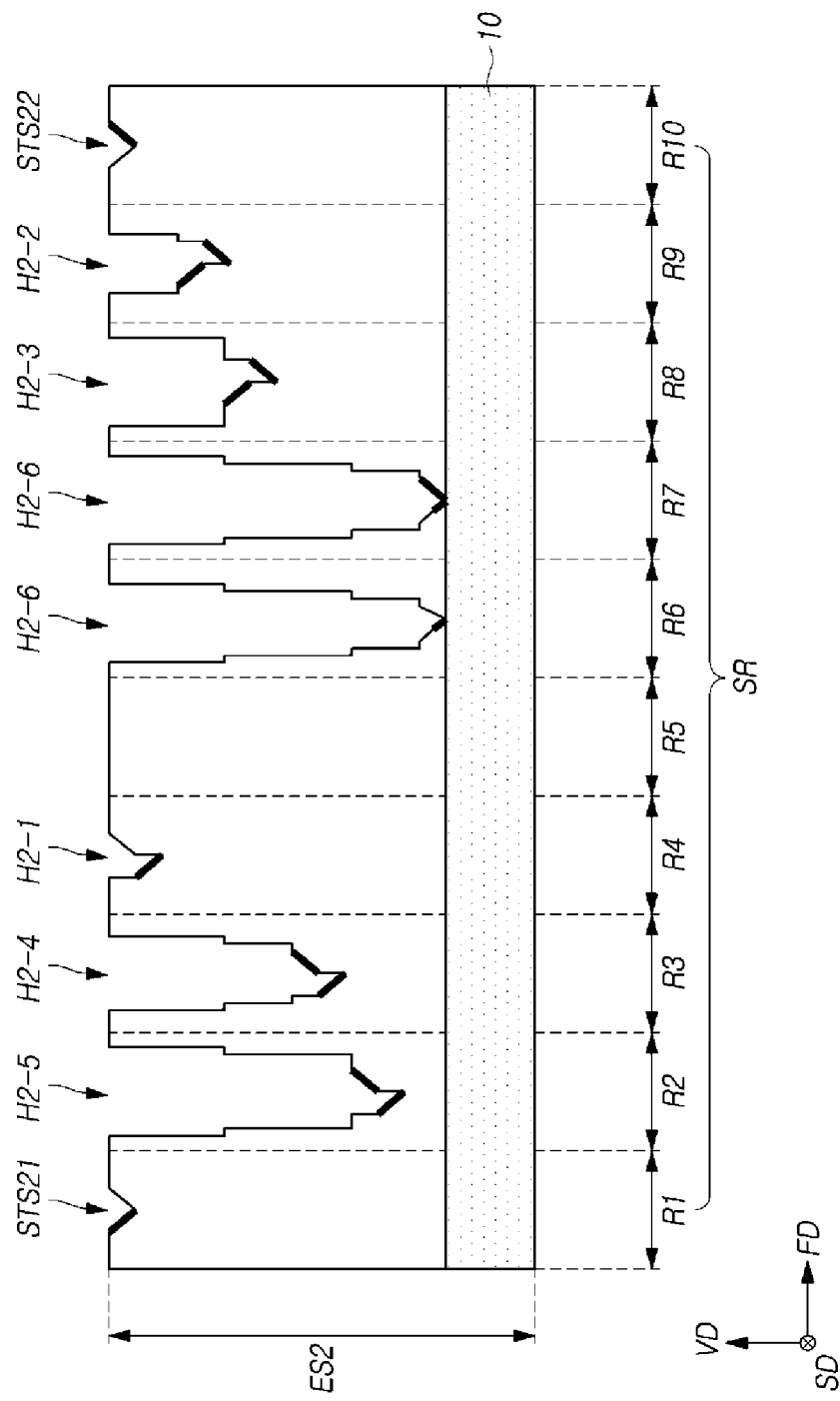
FIG. 5 is a cross-sectional view of a second electrode structure of FIG. 3 taken in the first direction.
Figure 6:
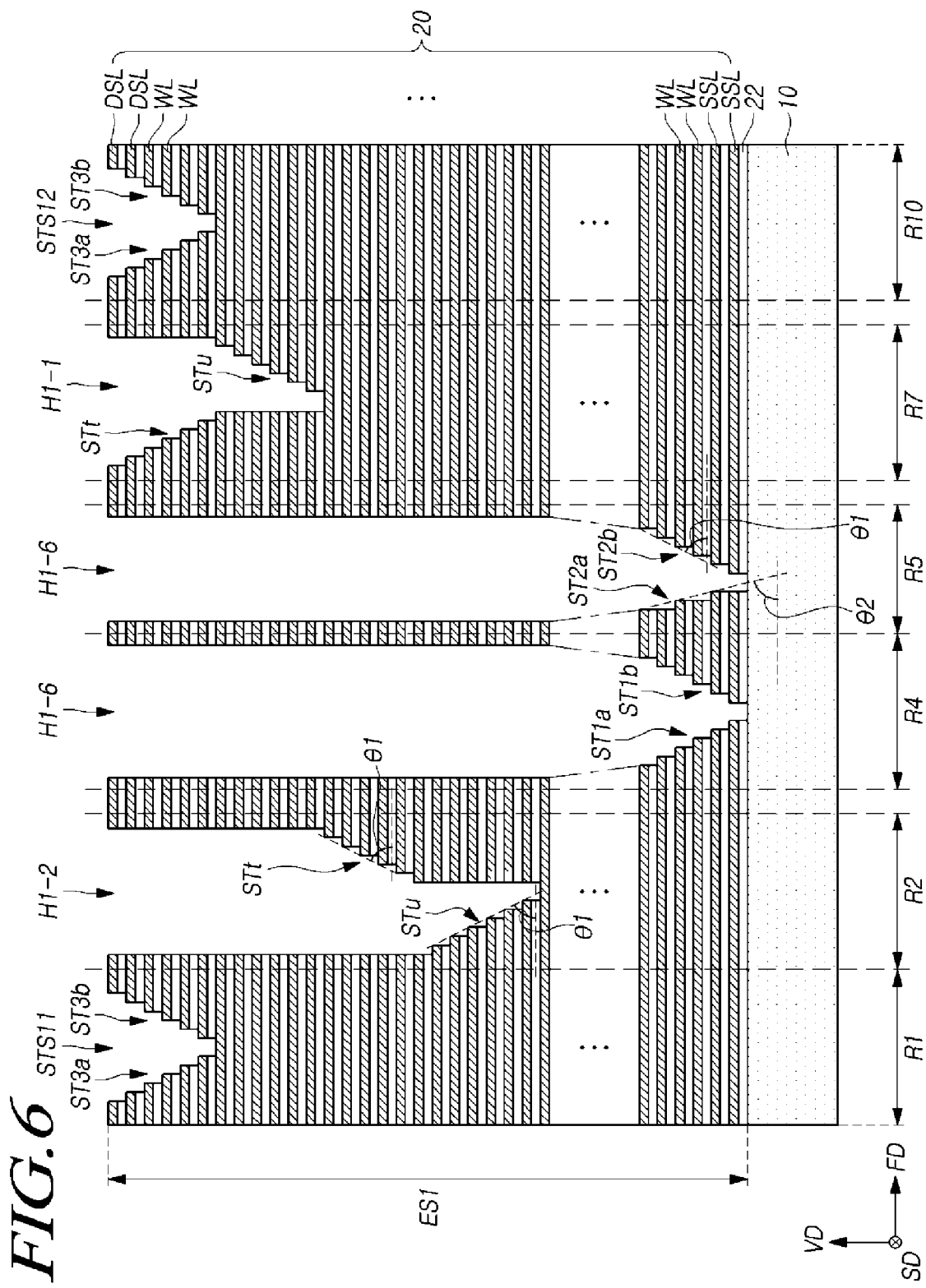
FIG. 6 is an enlarged view of some regions of FIG. 4.

FIG. 3 is a top view illustrating a part of a three-dimensional memory device in accordance with an embodiment of the present disclosure, FIG. 4 is a cross-sectional view of a first electrode structure of FIG. 3 taken in a first direction, FIG. 5 is a cross-sectional view of a second electrode structure of FIG. 3 taken in the first direction, and FIG. 6 is an enlarged view of some regions of FIG. 4.

Referring to FIGS. 3 to 5, a three-dimensional memory device in accordance with an embodiment of the present disclosure includes a first electrode structure ES1 and a second electrode structure ES2, which both extend in the first direction FD, are adjacent to each other in the second direction SD intersecting with the first direction FD, and both include a plurality of electrode layers 20 and a plurality of interlayer dielectric layers 22 alternately stacked on a source plate 10; a plurality of first slimming holes H1-1 to H1-6 that are formed in the first electrode structure ES1 to expose pad regions of the electrode layers 20 of the first electrode structure ES1 and are arranged in the first direction FD; and a plurality of second slimming holes H2-1 to H2-6 that are formed in the second electrode structure ES2 to expose pad regions of the electrode layers 20 of the second electrode structure ES2 and are arranged in the first direction FD. A first slimming hole and a second slimming hole that are adjacent in the second direction SD have different depths.

The first electrode structure ES1 and the second electrode structure ES2 may be disposed on a first cell region CR1, a slimming region SR and a second cell region CR2 of the source plate 10. The slimming region SR may be divided into a plurality of regions R1 to R10, which are arranged in the first direction FD. Hereinafter, for the sake of convenience in explanation, the plurality of regions R1 to R10 are defined as first to tenth regions R1 to R10. The first region R1 and the tenth region R10 may be arranged in the first direction FD at the ends of the slimming region SR, and the second to ninth regions R2 to R9 may be arranged in the first direction FD between the first region R1 and the tenth region R10.

The plurality of first slimming holes H1-1 to H1-6 may be configured in the second to fifth regions R2 to R5 and the seventh to ninth regions R7 to R9 of the first electrode structure ES1. In the reference symbol H1-# of a first slimming hole, the number # has a value corresponding to the depth order of the depth of the first slimming hole in the vertical direction VD. The number # of a deeper first slimming hole has a greater value than the number # of a shallower first slimming hole. For example, among the first slimming holes H1-1 to H1-6, the depth of the first slimming hole denoted by the reference symbol H1-1 is shallowest, and the depth of the first slimming hole denoted by the reference symbol H1-6 is deepest. FIG. 3 illustrates an example in which the number of first slimming holes may be odd.

The plurality of second slimming holes H2-1 to H2-6 may be configured in the second to fourth regions R2 to R4 and the sixth to ninth regions R6 to R9 of the second electrode structure ES2. Each of the second slimming holes H2-1 to H2-6 has the same number # and substantially the same depth as each of the first slimming holes H1-1 to H1-6, respectively. For example, the second slimming hole H2-2 with the number # of 2 has substantially the same depth as the first slimming hole H1-2 with the number # of 2.

The number of second slimming holes may be the same as the number of first slimming holes. For example, the number of first slimming holes and the number of second slimming holes may both be odd.

One first slimming hole and one second slimming hole may be disposed in each of the second to fourth regions R2 to R4 and the seventh to ninth regions R7 to R9. A first slimming hole and a second slimming hole that are disposed in a single region may be adjacent to each other in the second direction SD, and may have different depths. For example, in the second region R2, the first slimming hole H1-2 and the second slimming hole H2-5, which have different numbers #, that is, different depths, are disposed to be adjacent to each other in the second direction SD.

In an embodiment, there may be two each of the first slimming holes H1-6 and the second slimming holes H2-6, all of which have the deepest depth. One of the two first slimming holes H1-6 may be disposed to be adjacent in the second direction SD to the second slimming hole H2-1, which has the shallowest depth. The other of the two first slimming holes H1-6 may be disposed such that it is not adjacent to any of the plurality of second slimming holes H2-1 to H2-6 in the second direction SD. In FIG. 3, the two first slimming holes H1-6 are disposed in the fourth region R4 and the fifth region R5, respectively. The first slimming hole H1-6 of the fourth region R4 is disposed to be adjacent in the second direction SD to the second slimming hole H2-1. The plurality of second slimming holes H2-1 to H2-6 are not disposed in the fifth region R5. The first slimming hole H1-6 of the fifth region R5 is not adjacent to the plurality of second slimming holes H2-1 to H2-6 in the second direction SD.

One of the two second slimming holes H2-6 may be disposed to be adjacent in the second direction SD to the first slimming hole H1-1, which like second slimming hole H2-1 has the shallowest depth, and the other of the two second slimming holes H2-6 may be disposed not to be adjacent to the plurality of first slimming holes H1-1 to H1-6 in the second direction SD. In FIG. 3, the two second slimming holes H2-6 having the deepest depth are disposed in the sixth region R6 and the seventh region R7, respectively. The second slimming hole H2-6 of the seventh region R7 is disposed to be adjacent in the second direction SD to the first slimming hole H1-1 having the shallowest depth. The plurality of first slimming holes H1-1 to H1-6 are not disposed in the sixth region R6. The second slimming hole H2-6 of the sixth region R6 is not adjacent to the plurality of first slimming holes H1-1 to H1-6 in the second direction SD.

First slits SLT1, which extend in the first direction FD, may be configured on both sides of the first electrode structure ES1 in the second direction SD and on both sides of the second electrode structure ES2 in the second direction SD. The first electrode structure ES1 and the second electrode structure ES2 may be separated from each other by a first slit SLT1 positioned therebetween.

A second slit SLT2, which extends in the first direction FD, may be defined at the center portion, in the second direction SD, of each of the first electrode structure ES1 and the second electrode structure ES2. The second slit SLT2 may divide the first electrode structure ES1 into two memory blocks BLK1 and divide the second electrode structure ES2 into two memory blocks BLK2. Hereinafter, for the sake of convenience in explanation, the memory blocks BLK1 included in the first electrode structure ES1 are defined as first memory blocks, and the memory blocks BLK2 included in the second electrode structure ES2 are defined as second memory blocks.

The second slit SLT2 defined in the first electrode structure ES1 may traverse the center portions of the first slimming holes H1-1 to H1-6 in the first direction FD. The first slimming holes H1-1 to H1-6 may have structures that are symmetrical with respect to the second slit SLT2 defined in the first electrode structure ES1. The second slit SLT2 defined in the second electrode structure ES2 may traverse the center portions of the second slimming holes H2-1 to H2-6 in the first direction FD. The second slimming holes H2-1 to H2-6 may have structures that are symmetrical with respect to the second slit SLT2 defined in the second electrode structure ES2.

The plurality of first slimming holes H1-1 to H1-6 and the plurality of second slimming holes H2-1 to H2-6 may be formed using etching processes referred to as an X-slim process and a Z-slim process. After a step structure is formed by the X-slim process, the step structure may be transferred downward by the Z-slim process. The X-slim process and the Z-slim process will be described later with reference to FIGS. 14A to 14F.

In FIG. 3, rectangular boxes illustrated in the first slimming holes H1-1 to H1-6 and the second slimming holes H2-1 to H2-6 correspond to regions that are etched by Z-slim processes, and the number of rectangular boxes included in each slimming hole correspond to the number of Z-slim processes used to form the illustrated slimming hole.

First step-shaped slits STS11 and STS12 (see FIG. 4) may be formed in the first region R1 and the tenth region R10, respectively, of the first electrode structure ES1, and second step-shaped slits STS21 and STS22 (see FIG. 5) may be formed in the first region R1 and the tenth region R10, respectively, of the second electrode structure ES2. The first step-shaped slits STS11 and STS12 and the second step-shaped slits STS21 and STS22 may be formed using the X-slim process. For the sake of simplicity in illustration, FIG. 3 does not illustrate the first step-shaped slits STS11 and STS12 and the second step-shaped slits STS21 and STS22.

The first step-shaped slits STS11 and STS12 may be formed in the upper electrode layers 20 and the upper interlayer dielectric layers 22 of the first electrode structure ES1. Although not illustrated in detail, the first step-shaped slits STS11 and STS12 may traverse the first electrode structure ES1 in the second direction SD, and the upper electrode layers 20 of the first electrode structure ES1 may be cut by the first step-shaped slits STS11 and STS12.

The second step-shaped slits STS21 and STS22 may be formed in the upper electrode layers 20 and the upper interlayer dielectric layers 22 of the second electrode structure ES2. Although not illustrated in detail, the second step-shaped slits STS21 and STS22 may traverse the second electrode structure ES2 in the second direction SD, and the upper electrode layers 20 of the second electrode structure ES2 may be cut by the second step-shaped slits STS21 and STS22.

Referring to FIG. 6, a pair of step structures may be configured in each of the first step-shaped slits STS11 and STS12 and the first slimming holes H1-1 to H1-6. Similarly, a pair of step structures may be configured in each of the second step-shaped slits STS21 and STS22 and the second slimming holes H2-1 to H2-6. For the sake of simplicity in illustration, FIGS. 4 and 5 illustrate each step structure by its slope rather than its actual shape. Accordingly, it should be understood that any inclined portion in FIGS. 4 and 5 represents a step structure.

In FIGS. 4 and 5, an inclined portion illustrated by a thick line means a portion where pad regions of electrode layers 20 are positioned, and an inclined portion illustrated by a thin line means a portion where dummy pad regions of electrode layers 20 are positioned. A contact that serves to transfer an electrical signal to the electrode layer 20 may be coupled to the pad region. The dummy pad region has the same or similar structure and shape as or to the pad region, but without substantially the same function. No contact is coupled to the dummy pad region.

Aside from the first slimming holes H1-6 having the deepest depth, each of the remaining first slimming holes H1-1 to H1-5 may have an upper step structure STt and a lower step structure STu. When viewed from the top, the upper step structure STt and the lower step structure STu may be arranged in the first direction FD.

The first slimming holes H1-2 to H1-5 may be disposed in the second, third, eighth and ninth regions R2, R3, R8 and R9, respectively. Pad regions may be configured in the upper step structure STt and the lower step structure STu of each of the first slimming holes H1-2 to H1-5. FIG. 6 illustrates an exemplary configuration of the upper step structure STt and the lower step structure Stu in first slimming hole H1-2 in second region R2. Similar upper step structures STt and lower step structures Stu may be formed at different vertical depths in first slimming holes H1-3, H1-4 and H1-5.

The first slimming hole H1-1 having the shallowest depth may be configured such that the upper step structure STt overlaps the first step-shaped slits STS11 and STS12 in the first direction FD. Pad regions may be configured in the lower step structure STu of the first slimming hole H1-1, and dummy pad regions may be configured in the upper step structure STt of the first slimming hole H1-1. The number of pad regions configured in the first slimming hole H1-1 may be smaller than the number of pad regions configured in each of the first slimming holes H1-2 to H1-5 of the second, third, eighth and ninth regions R2, R3, R8 and R9.

One of the two first slimming holes H1-6 having the deepest depth may be disposed in the fourth region R4 and may include a pair of first step structures ST1a and ST1b on the lower sidewalls thereof, and the other of the two first slimming holes H1-6 having the deepest depth may be disposed in the fifth region R5 and may include a pair of second step structures ST2a and ST2b on the lower sidewalls thereof. The first step structures ST1a and ST1b may face each other in the first direction FD and have symmetrical structures. The second step structures ST2a and ST2b may face each other in the first direction FD and have asymmetrical structures.

Of the first step structures ST1a and ST1b, pad regions may be configured in the first step structure ST1a, which is closer to the first cell region CR1 (see FIG. 3) than the first step structure ST1b. Pad regions and dummy pad regions may be configured in the first step structure ST1b, which is farther from the first cell region CR1 (see FIG. 3) than the first step structure ST1a. The number of pad regions included in the first step structure ST1b may be smaller than the number of pad regions included in the first step structure ST1a. In FIG. 4, an inclined portion corresponding to the first step structure ST1a is entirely illustrated by a thick line. The inclined portion corresponding to the first step structure ST1b is illustrated by a thick line at a lower portion of the inclined portion and by a thin line at an upper portion of the inclined portion. The number of pad regions configured in the first slimming hole H1-6 of the fourth region R4 may be smaller than the number of pad regions configured in each of the first slimming holes H1-2 to H1-5 of the second, third, eighth and ninth regions R2, R3, R8 and R9.

Of the second step structures ST2a and ST2b in fifth region R5, dummy pad regions may be configured in the second step structure ST2a, which is farther from the second cell region CR2 (see FIG. 3) than the second step structure ST2b. Pad regions and dummy pad regions may be configured in the second step structure ST2b, which is closer to the second cell region CR2 (see FIG. 3) than the second step structure ST2a. In FIG. 4, an inclined portion corresponding to the second step structure ST2a is entirely illustrated by a thin line. The inclined portion corresponding to the second step structure ST2b is illustrated by a thick line at a lower portion of the inclined portion and is illustrated by a thin line at an upper portion of the inclined portion. The number of pad regions configured in the first slimming hole H1-6 of the fifth region R5 may be smaller than the number of pad regions configured in the first slimming hole H1-6 of the fourth region R4.

As will be described later with reference to FIG. 7, the two first slimming holes H1-6 may pass through a source select line of the first electrode structure ES1. The source select line may be divided into units of strings, each of which is smaller than a memory block. The two first slimming holes H1-6 may be configured to divide the source select line into units of strings and to arrange pad regions in each part of the divided source select line into units of strings. The structure of the source select line will become more apparent through the description below with reference to FIG. 7.

Each of the first step-shaped slits STS11 and STS12 may include a pair of third step structures ST3a and ST3b. The third step structures ST3a and ST3b may face each other in the first direction FD and have symmetrical structures.

Of the third step structures ST3a and ST3b of the first region R1, pad regions may be configured in the third step structure ST3a which is closer to the first cell region CR1 (see FIG. 3) than the third step structure ST3b. Dummy pad regions may be configured in the third step structure ST3b, which is farther from the first cell region CR1 (see FIG. 3) than the third step structure ST3a. Of the third step structures ST3a and ST3b of the tenth region R10, pad regions may be configured in the third step structure ST3b, which is closer to the second cell region CR2 (see FIG. 3) than third step structure ST3a. Dummy pad regions may be configured in the third step structure ST3a, which is farther from the second cell region CR2 (see FIG. 3) than third step structure ST3a.

The first step-shaped slits STS11 and STS12 may be configured such that the third step structures ST3a and ST3b overlap, in the first direction FD, the upper step structure STt of the first slimming hole H1-1 of seventh region R7. The number of pad regions configured in each of the first step-shaped slits STS11 and STS12 may be smaller than the number of pad regions configured in each of the first slimming holes H1-2 to H1-5 of the second, third, eighth and ninth regions R2, R3, R8 and R9.

Referring back to FIG. 3, a virtual first line L1 extends in the second direction SD at the center portion of the slimming region SR. A virtual second line L2 extends in the first direction FD at the center portion of the first slit SLT1 and between the first electrode structure ES1 and the second electrode structure ES2. The second slimming holes H2-1 to H2-6 may have structures that are symmetrical to the first slimming holes H1-1 to H1-6 on the basis of an intersection P1 of the virtual first line L1 and the virtual second line L2. The second step-shaped slits STS21 and STS22 may have structures that are symmetrical to the first step-shaped slits STS11 and STS12 on the basis of the intersection P1. In other words, from the top view illustrated in FIG. 3, when the second slimming holes H2-1 to H2-6 and the second step-shaped slits STS21 and STS22 are rotated by 180 degrees about the intersection P1, the second slimming holes H2-1 to H2-6 and the second step-shaped slits STS21 and STS22 may completely overlap the first slimming holes H1-1 to H1-6 and the first step-shaped slits STS11 and STS12, respectively. As a result, the second slimming holes H2-1 to H2-6 and the second step-shaped slits STS21 and STS22 have point symmetric structures with respect to the first slimming holes H1-1 to H1-6 and the first step-shaped slits STS11 and STS12, detailed descriptions for the structures of the second slimming holes H2-1 to H2-6 and the second step-shaped slits STS21 and STS22 will be omitted.

In FIG. 3, the second slimming hole H2-1 of the fourth region R4 may have a structure that is symmetrical to the first slimming hole H1-1 of the seventh region R7 as a result of two-dimensional point reflection around the intersection P1. The second slimming hole H2-1 of the fourth region R4 has the shallowest depth from among the second slimming holes H2-1 to H2-6. The number of pad regions configured in the second slimming hole H2-1 of the fourth region R4 may be the same as the number of pad regions configured in the first slimming hole H1-1 of the seventh region R7. The number of pad regions configured in the second slimming hole H2-1 of the fourth region R4 may be smaller than the number of pad regions configured in each of the second slimming holes H2-2 to H2-5 of the second, third, eighth and ninth regions R2, R3, R8 and R9.

The second slimming hole H2-6 of the seventh region R7 may have a structure that is symmetrical to the first slimming hole H1-6 of the fourth region R4 as a result of two-dimensional point reflection around the intersection P1. The number of pad regions configured in the second slimming hole H2-6 of the seventh region R7 may be the same as the number of pad regions configured in the first slimming hole H1-6 of the fourth region R4. The number of pad regions configured in the second slimming hole H2-6 of the seventh region R7 may be smaller than the number of pad regions configured in each of the second slimming holes H2-2 to H2-5 of the second, third, eighth and ninth regions R2, R3, R8 and R9.

The second slimming hole H2-6 of the sixth region R6 may have a structure that is symmetrical to the first slimming hole H1-6 of the fifth region R5 as a result of two-dimensional point reflection around the intersection P1. The number of pad regions configured in the second slimming hole H2-6 of the sixth region R6 may be the same as the number of pad regions configured in the first slimming hole H1-6 of the fifth region R5. The number of pad regions configured in the second slimming hole H2-6 of the sixth region R6 may be smaller than the number of pad regions configured in the second slimming hole H2-6 of the seventh region R7.

The first slimming holes H1-1 to H1-6 and the second slimming holes H2-1 to H2-6 may be configured such that the sum of a first slimming hole and a second slimming hole that are adjacent to each other in the second direction SD, that is, positioned in a single region, is constant. In the case of FIG. 3, the sum of the depth indicator numbers of a first slimming hole and a second slimming hole that are adjacent to each other in the second direction SD is constant as 7. For example, the depth indicator number of first slimming hole H1-1 is one and the depth indicator number of first slimming hole H1-6 is six, and therefore the sum is seven. When the first slimming holes H1-1 to H1-6 and the second slimming holes H2-1 to H2-6 are disposed in this way, among the first slimming holes H1-1 to H1-6 and the second slimming holes H2-1 to H2-6, a first slimming hole and a second slimming hole whose numbers of pad regions are small are disposed in the same region, and a first slimming hole and a second slimming hole whose numbers of pad regions are large are disposed in the same region. For example, the first slimming hole H1-6 and the second slimming hole H2-1 having the numbers of pad regions that are small are disposed in the fourth region R4, and the first slimming hole H1-2 and the second slimming hole H2-5 having the numbers of pad regions that are large are disposed in the second region R2.

In FIG. 3, reference symbol CP denotes cell plugs. The cell plugs CP may pass through the first cell region CR1 and the second cell region CR2 of the first and second electrode structures ES1 and ES2 in the vertical direction VD to extend to the source plate 10. The cell plugs CP may be coupled with the electrode layers 20 of the first and second electrode structures ES1 and ES2 to configure memory cells.

Referring to FIG. 6, the upper step structure STt and the lower step structure STu may have substantially the same first inclination angle $\theta 1$ with respect to the top surface of the source plate 10. The upper step structure STt and the lower step structure Stu, which are configured in a single first slimming hole, may have opposite slope directions. For example, when the upper step structure STt has a slope of +$\theta 1$, the lower step structure STu may have a slope of −$\theta 1$.

The first slimming holes H1-6 having the deepest depth may be configured to pass through source selection lines SSL. The first step structures ST1a and ST1b may be configured on the lower sidewalls of the first slimming hole H1-6 of the fourth region R4. The second step structures ST2a and ST2b may be configured on the lower sidewalls of the first slimming hole H1-6 of the fifth region R5. The first step structures ST1a and ST1b and the second step structures ST2a and ST2b may overlap each other in the first direction FD.

The first step structures ST1a and ST1b may face each other in the first direction FD and have symmetrical structures. Although not illustrated in the figures, the first step structures ST1a and ST1b may have substantially the same first inclination angle $\theta 1$ with respect to the top surface of the source plate 10.

The second step structures ST2a and ST2b may face each other in the first direction FD and have asymmetrical structures. One of the second step structures ST2a and ST2b may have a steeper slope than the other. For example, of the second step structures ST2a and ST2b, the right second step structure ST2b, which is closer to the second cell region CR2 (see FIG. 3), may be configured to have the first inclination angle θ1 with respect to the top surface of the source plate 10, and the left second step structure ST2a, which is farther from the second cell region CR2 (see FIG. 3), may be configured to have a second inclination angle θ2 larger than the first inclination angle θ1 with respect to the top surface of the source plate 10.

The height of each step in the left second step structure ST2a may be higher than the height of each step in the right second step structure ST2b. For example, the step height of the right second step structure ST2b may be the same as a vertical pitch of the electrode layers 20, and the step height of the left second step structure ST2a may be larger than the vertical pitch of the electrode layers 20. The vertical pitch of the electrode layers 20 means a distance in the vertical direction VD between the top surfaces of adjacent electrode layers 20. FIG. 6 illustrates a step height of the left second step structure ST2a that is twice the vertical pitch of the electrode layers 20.

The number of steps of the left second step structure ST2a may be less than the number of steps of the right second step structure ST2b. For example, the number of steps of the left second step structure ST2a may be half the number of steps of the right second step structure ST2b.

As described above, the first step structures ST1a and ST1b of the first slimming hole H1-6 of the fourth region R4 may have a first inclination angle θ1 with respect to the top surface of the source plate 10. As described above with reference to FIGS. 3 to 5, the first slimming hole H1-6 and the second slimming hole H2-1 are disposed in the fourth region R4. Since the second slimming hole H2-1 of the fourth region R4 has a structure that is symmetrical to the first slimming hole H1-1 of the seventh region R7, in the same manner as the first slimming hole H1-1 of the seventh region R7, the step structures of the second slimming hole H2-1 of the fourth region R4 have the first inclination angle θ1 with respect to the top surface of the source plate 10. As will be described later with reference to FIG. 14A, the same X-slim process is used to form a first slimming hole and a second slimming hole that are disposed in the same region. Therefore, similar to the step structures of the second slimming hole H2-1 of the fourth region R4, the first step structures ST1a and ST1b of the first slimming hole H1-6 of the fourth region R4 also have a first inclination angle θ1 with respect to the top surface of the source plate 10.

As described above with reference to FIGS. 3 to 5, only the first slimming hole H1-6 is disposed in the fifth region R5, and no second slimming hole is disposed in the fifth region R5. As a result, pad regions are not configured in the second step structure ST2a of the first slimming hole H1-6 of the fifth region R5, the second step structure ST2a may be configured to have a steeper slope. When the second step structure ST2a is configured to have a steeper slope, a width of the second step structure ST2a in the first direction FD may decrease, and thus, it is possible to reduce a width of the fifth region R5 in the first direction FD. For the same reason, it is also possible to reduce a width of the sixth region R6 in the first direction FD. A width of each of the fifth region R5 and the sixth region R6 in the first direction FD may be smaller than a width of each of the first to fourth regions R1 to R4 and the seventh to tenth regions R7 to R10 in the first direction FD. When widths of the fifth region R5 and the sixth region R6 in the first direction FD are configured to have smaller sizes, it is possible to reduce the total dimension of the three-dimensional memory device in the first direction FD.

Figure 7:
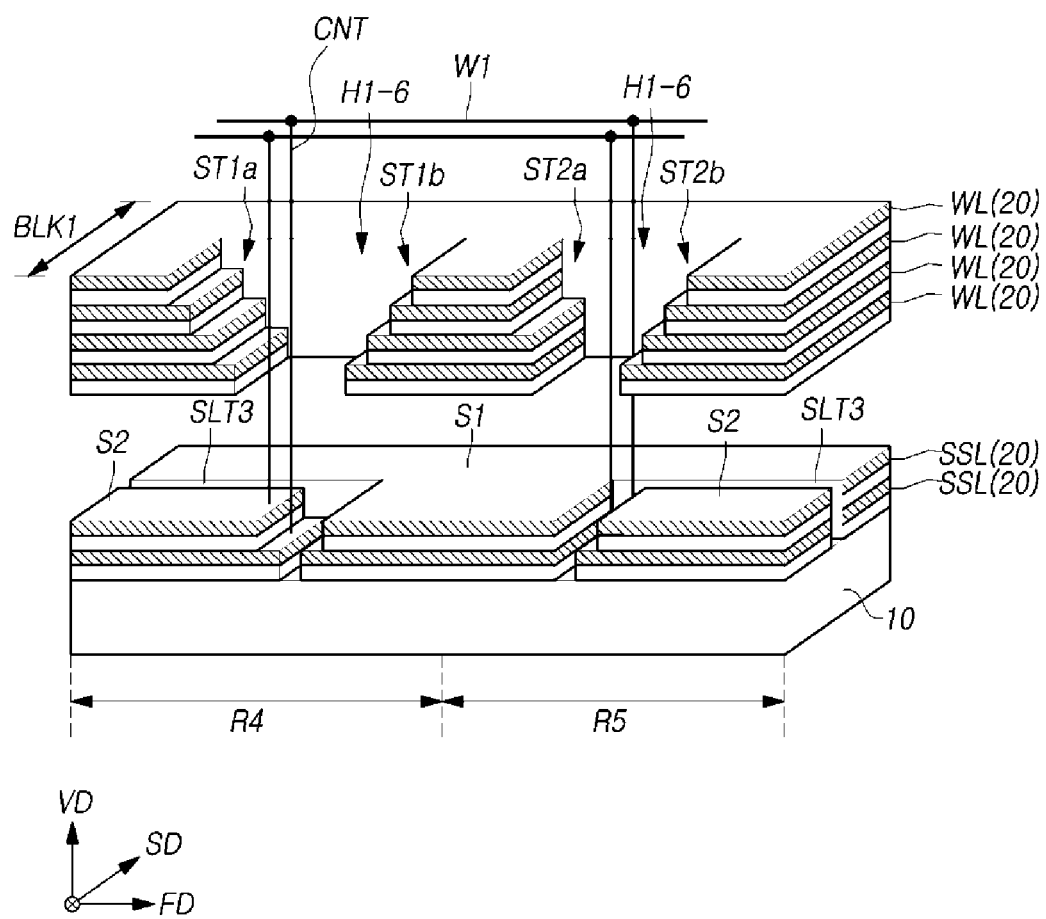
FIG. 7 is a view illustrating the structure of source select lines of FIG. 6.

FIG. 7 is a view illustrating the structure of source select lines of FIG. 6.

Referring to FIGS. 6 and 7, a pair of first slimming holes H1-6 having the deepest depth may pass through source select lines SSL. A pair of third slits SLT3, which extend in opposite directions relative to each other in the first direction FD from the pair of first slimming holes H1-6, may be formed in the source select lines SSL. The source select lines SSL may be divided into units of strings by the pair of third slits SLT3 and the pair of first slimming holes H1-6. A first line part S1 corresponding to a first string may have a T-shaped planar structure having a protrusion that is disposed between the two first slimming holes H1-6. A second line part S2 corresponding to a second string may be divided into two portions to be disposed on both sides of the T-shaped protrusion in the first direction FD.

Pad regions of word lines WL and pad regions of second line parts S2 of the source select lines SSL may be configured in the left first step structure ST1a. Pad regions of first line parts S1 of the source select lines SSL may be configured in the right first step structure ST1b. Pad regions of the second line parts S2 of the source select lines SSL may be configured in the right second step structure ST2b.

A contact CNT may be coupled to each of the pad regions. The contact CNT may serve to transfer an operating voltage, provided from a row decoder, to a corresponding electrode layer 20. For the sake of simplicity in illustration, FIG. 7 illustrates a limited number of contacts CNT.

Each of contacts CNT, coupled to the pad regions of the second line parts S2 positioned in the left first step structure ST1a, and each of contacts CNT, coupled to the pad regions of the second line parts S2 positioned in the right second step structure ST2b, which correspond to each other, may be coupled through a wiring line W1. The two portions configuring the second line part S2 may be electrically coupled to each other through the contact CNT and the wiring line W1.

Figure 8:
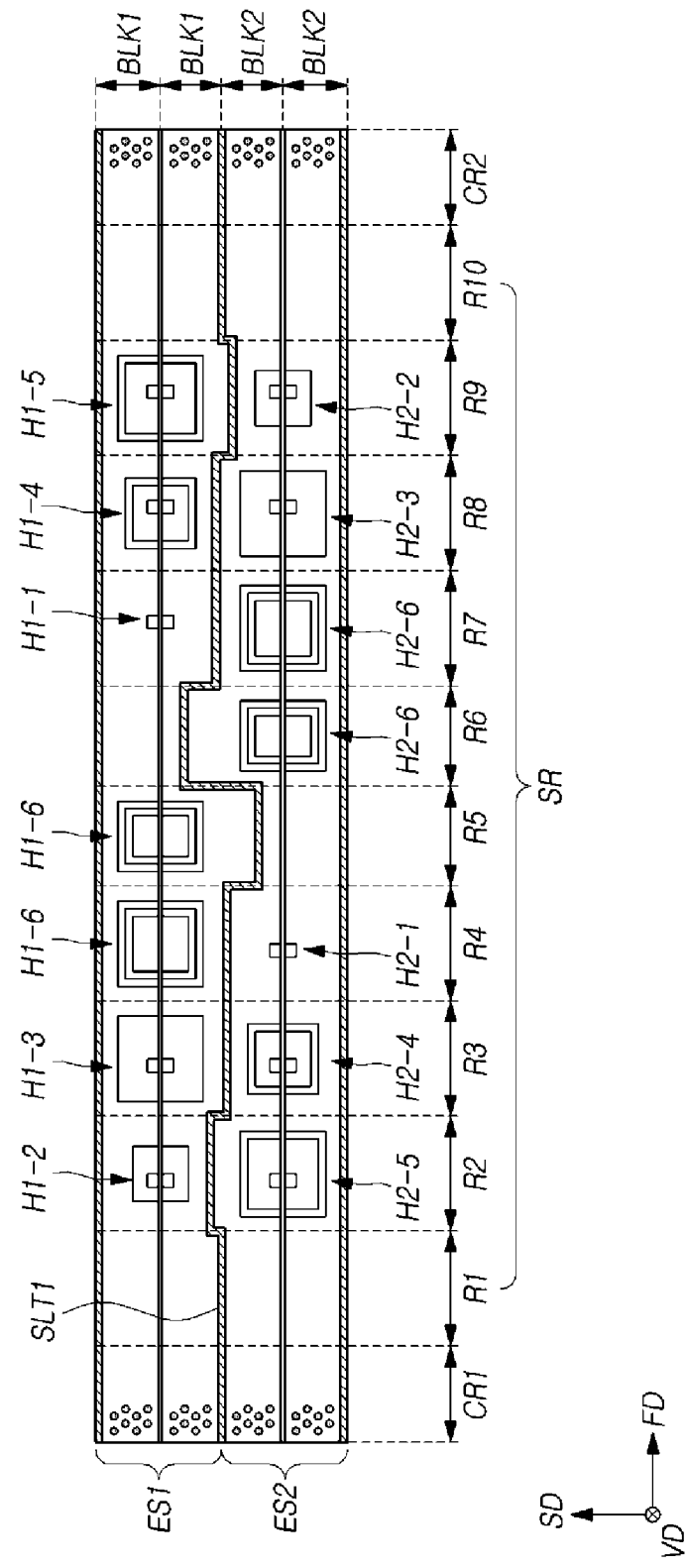
FIG. 8 is a top view illustrating a three-dimensional memory device in accordance with another embodiment of the present disclosure.

FIG. 8 is a top view illustrating a three-dimensional memory device in accordance with another embodiment of the present disclosure.

Referring to FIG. 8, the first slit SLT1, which is positioned between the first electrode structure ES1 and the second electrode structure ES2, may be configured to have a bent shape such that a width of the first electrode structure ES1 in the second direction SD and a width of the second electrode structure ES2 in the second direction SD change in correspondence to a depth of a first slimming hole and a depth of a second slimming hole.

The first slit SLT1 may have a bent shape such that, in a region in which a depth of a first slimming hole is deeper than a depth of a second slimming hole, a width of the first electrode structure ES1 in the second direction is larger than a width of the second electrode structure ES2 in the second direction SD and, in a region where a depth of a first slimming hole is shallower than a depth of a second slimming hole, a width of the first electrode structure ES1 in the second direction SD is smaller than a width of the second electrode structure ES2 in the second direction SD. For example, in the fourth region R4, the depth of the first slimming hole H1-6 is deeper than the depth of the second slimming hole H2-1, and therefore the width of the first electrode structure ES1 in second direction SD is larger than the width of the second electrode structure ES2 in the second direction SD. In another example, in the second region R2, the depth of the first slimming hole H1-2 is shallower than the depth of the second slimming hole H2-5, and therefore the width of the first electrode structure ES1 in second direction SD is smaller than the width of the second electrode structure ES2 in the second direction SD.

Figure 9:
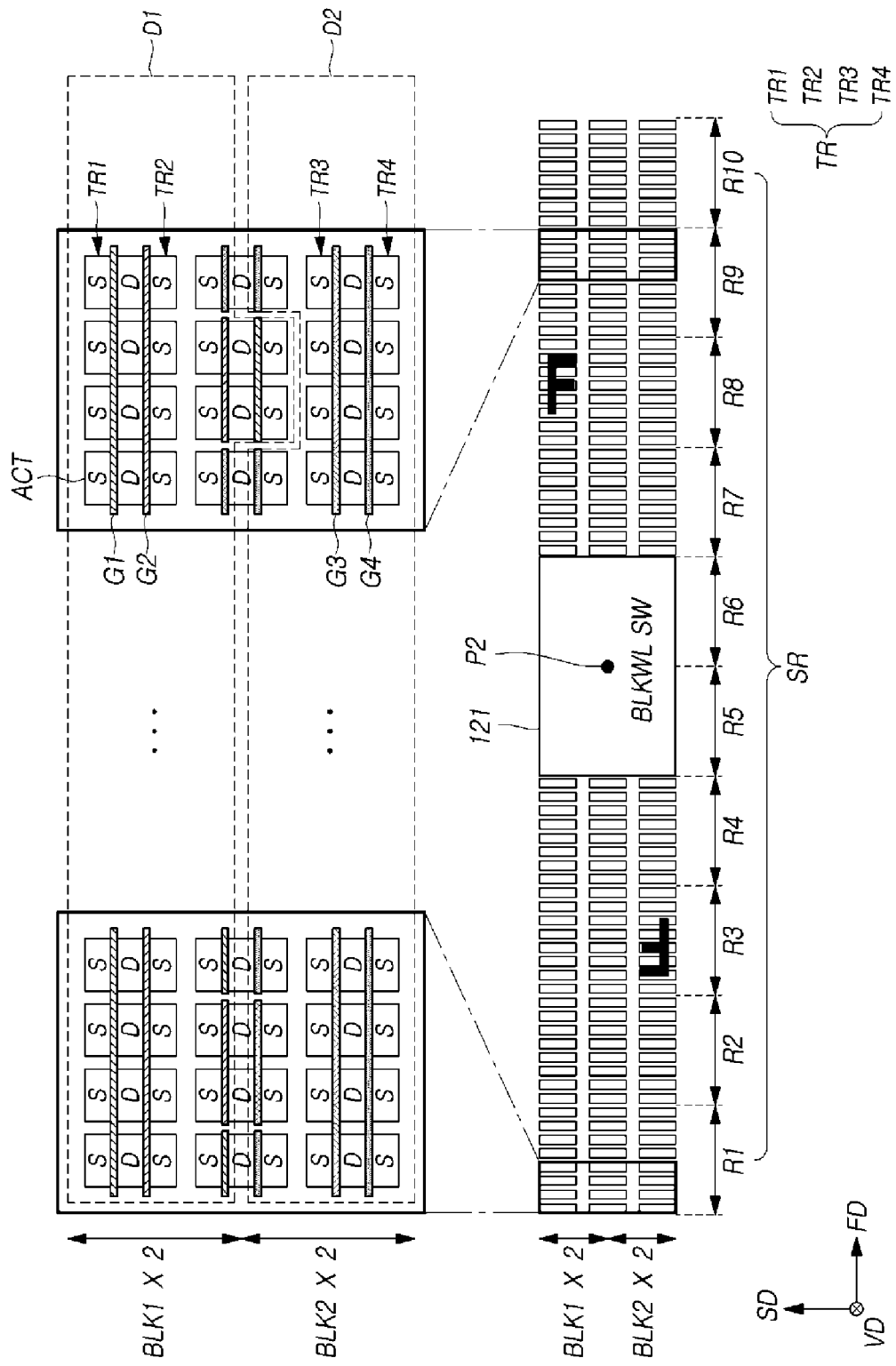
FIG. 9 is a top view illustrating a row decoder of a three-dimensional memory device in accordance with an embodiment of the present disclosure.

FIG. 9 is a top view illustrating parts of a row decoder of a three-dimensional memory device in accordance with an embodiment of the present disclosure. The row decoder overlaps the first and second electrode structures ES1 and ES2 of FIG. 3 in the vertical direction VD.

Referring to FIG. 9, a block switch circuit 121 and a plurality of pass transistors TR may be disposed in the slimming region SR of a second semiconductor layer. The block switch circuit 121 may generate a block selection signal in response to a row address provided from a peripheral circuit, and may provide the generated block selection signal to the pass transistors TR.

The block switch circuit 121 may be disposed in the fifth region R5 and the sixth region R6. The first slimming hole H1-6 of the fifth region R5 and the second slimming hole H2-6 of the sixth region R6 illustrated in FIG. 3 may overlap the block switch circuit 121 in the vertical direction VD.

The plurality of pass transistors TR may be disposed in the remaining regions R1 to R4 and R7 to R10, but not in the fifth region R5 and the sixth region R6. The plurality of pass transistors TR may be respectively coupled to the electrode layers 20 (see FIG. 4) of the two first memory blocks BLK1 included in the first electrode structure ES1 (see FIG. 3) and the electrode layers 20 (see FIG. 4) of the two second memory blocks BLK2 included in the second electrode structure ES2 (see FIG. 3). Each pass transistor TR may be turned on in response to the block selection signal to transfer an operating voltage, provided from the peripheral circuit through a global row line, to a corresponding electrode layer 20.

Hereinafter, for the sake of convenience in explanation, pass transistors TR coupled to one of the two first memory blocks BLK1 are defined as first pass transistors TR1, and pass transistors TR coupled to the other of the two first memory blocks BLK1 are defined as second pass transistors TR2. Further, pass transistors TR coupled to one of the two second memory blocks BLK2 are defined as third pass transistors TR3, and pass transistors TR coupled to the other of the two second memory blocks BLK2 are defined as fourth pass transistors TR4.

A first pass transistor TR1 may be turned on in response to a block selection signal applied to a first gate line G1 to transfer an operating voltage, provided to a drain region D from the peripheral circuit through the global row line, to a source region S. Accordingly, the first pass transistor TR1 may apply the operating voltage to a corresponding electrode layer 20. Each of the second to fourth pass transistors TR2 to TR4 may have a structure similar to that of the first pass transistor TR1, and may operate in a similar manner.

In FIG. 9, pass transistors TR that are positioned in a dotted-line box indicated by D1 represent pass transistors TR that are coupled to the first memory blocks BLK1, and pass transistors TR that are positioned in a dotted-line box indicated by D2 represent pass transistors TR which are coupled to the second memory blocks BLK2. Namely, the first and second pass transistors TR1 and TR2 are disposed in the dotted-line box indicated by D1, and the third and fourth pass transistors TR3 and TR4 are disposed in the dotted-line box indicated by D2.

A pass transistor TR may be coupled to a pad region that is disposed in the same region. For example, the pass transistor TR of the ninth region R9 may be coupled to a pad region of the ninth region R9.

The plurality of pass transistors TR may be configured to form pairs, in each of which two pass transistors TR are adjacent to each other in the second direction SD within one active region ACT. Each of the plurality of pass transistors TR may be provided as a pair of pass transistors TR that share one active region ACT. Since two pass transistors TR share one active region ACT, an area that is occupied by an inactive region between active regions ACT may be reduced, and thus, it is possible to configure the row decoder in a smaller area. Two pass transistors TR that are configured in one active region ACT may share one drain region D, and may share one global row line that is coupled to the one drain region D.

A plurality of active regions ACT may be disposed in a plurality of rows in the second direction SD in the slimming region SR, which overlaps the first and second electrode structures ES1 and ES2 (see FIG. 3) in the vertical direction VD.

In order to increase erase efficiency, the size of a memory block needs to be reduced, and in order to reduce the size of the memory block, the width of the first and second electrode structures ES1 and ES2 (see FIG. 3) in the second direction SD should be reduced. The number of rows of active regions overlapping the first and second electrode structures ES1 and ES2 (see FIG. 3) in the vertical direction VD will be reduced. Meanwhile, in order to improve the degree of integration, the number of electrode layers to be stacked should be increased. If the number of electrode layers increases, then the number of pass transistors TR increases. Thus, in order to configure the pass transistors TR to overlap the first and second electrode structures ES1 and ES2 (see FIG. 3) in the vertical direction VD, the number of rows of active regions overlapping the first and second electrode structures ES1 and ES2 (see FIG. 3) in the vertical direction VD must increase. Due to these requirements, in some design specifications, an odd number of rows of active regions overlapping the first and second electrode structures ES1 and ES2 (see FIG. 3) in the vertical direction VD may be necessary. FIG. 9 illustrates three rows of active regions overlapping the first and second electrode structures ES1 and ES2 (see FIG. 3) in the vertical direction VD.

When the number of rows of active regions is an odd number, the pass transistors TR1 and TR2 that are coupled to the first memory blocks BLK1 of the first electrode structure ES1, and the pass transistors TR3 and TR4 that are coupled to the second memory blocks BLK2 of the second electrode structure ES2, will share at least one row of active regions.

The electrode layer 20 of the first memory blocks BLK1 and the electrode layer 20 of the second memory blocks BLK2, which have the same stack order, may have the same physical block address. A physical block address may be a page number that indicates a specific word line in a memory block. The electrode layer 20 of the first memory blocks BLK1 and the electrode layer 20 of the second memory blocks BLK2 that have the same stack order may have the same physical block address.

In the first region R1, the first step-shaped slit STS11 (see FIG. 4) of the first electrode structure ES1 (see FIG. 4) and the second step-shaped slit STS21 (see FIG. 5) of the second electrode structure ES2 (see FIG. 5) are formed at the same depth. Thus, two of the electrode layers 20 of the first memory blocks BLK1 whose pad regions are exposed by the first step-shaped slit STS11 (see FIG. 4) and two of the electrode layers 20 of the second memory blocks BLK2 whose pad regions are exposed by the second step-shaped slit STS21 (see FIG. 5) have the same stack orders. As a result, they may have the same page numbers. Electrode layers included in different memory blocks and having the same page number may be coupled in common to one global row line, so the two pass transistors TR1 and TR2 that are coupled to the two first memory blocks BLK1 included in the first electrode structure ES1, and the two pass transistors TR3 and TR4 that are coupled to the two second memory blocks BLK2 included in the second electrode structure ES2, may be configured to be coupled in common to one global row line and to share the one global row line.

As described above, two pass transistors TR configured in one active region ACT may share one global row line, and a pass transistor TR coupled to the first electrode structure ES1 in the first region R1 and a pass transistor TR coupled to the second electrode structure ES2 in the first region R1 may share a global row line. The pass transistor TR coupled to the first electrode structure ES1 in the first region R1 and the pass transistor TR coupled to the second electrode structure ES2 in the first region R1 may be configured in one active region ACT. As illustrated in FIG. 9, in a second row of active regions of the first region R1, the first pass transistor TR1 and the fourth pass transistor TR4 are configured in one active region ACT, and the second pass transistor TR2 and the third pass transistor TR3 are configured in one active region ACT. Although not illustrated, similar to the first region R1, in the tenth region R10, a pass transistor TR coupled to the first electrode structure ES1 and a pass transistor TR coupled to the second electrode structure ES2 may be configured in one active region ACT.

In the ninth region R9, as the first slimming hole H1-5 (see FIG. 4) of the first electrode structure ES1 (see FIG. 4) and the second slimming hole H2-2 (see FIG. 5) of the second electrode structure ES2 (see FIG. 5) are formed at different depths, the stack orders of the electrode layers 20 of the first memory blocks BLK1, whose pad regions are exposed by the first slimming hole H1-5 (see FIG. 4), and the stack orders of the electrode layers 20 of the second memory blocks BLK2, whose pad regions are exposed by the second slimming hole H2-2 (see FIG. 5), are different from each other. Thus, when page numbers are assigned on the basis of stack orders, the electrode layers 20 of the first memory blocks BLK1 whose pad regions are exposed by the first slimming hole H1-5 (see FIG. 4) and the electrode layers 20 of the second memory blocks BLK2 whose pad regions are exposed by the second slimming hole H2-2 (see FIG. 5) will have different page numbers. Because the pass transistors TR1 and TR2 coupled to the first memory blocks BLK1 and the pass transistors TR3 and TR4 coupled to the second memory blocks BLK2 should not share a global row line, a pass transistor TR coupled to the first electrode structure ES1 and a pass transistor TR coupled to the second electrode structure ES2 should be configured in different active regions ACT. For this reason, in the ninth region R9 of FIG. 9, the first and second pass transistors TR1 and TR2 coupled to the first electrode structure ES1 are configured not to share an active region ACT with the third and fourth pass transistors TR3 and TR4 coupled to the second electrode structure ES2.

Although not illustrated, in the same manner as in the ninth region R9, in each of the second to fourth regions R2 to R4 and the seventh and eighth regions R7 and R8, a pass transistor TR coupled to the first electrode structure ES1 and a pass transistor TR coupled to the second electrode structure ES2 should be configured in different active regions ACT.

Figure 10:
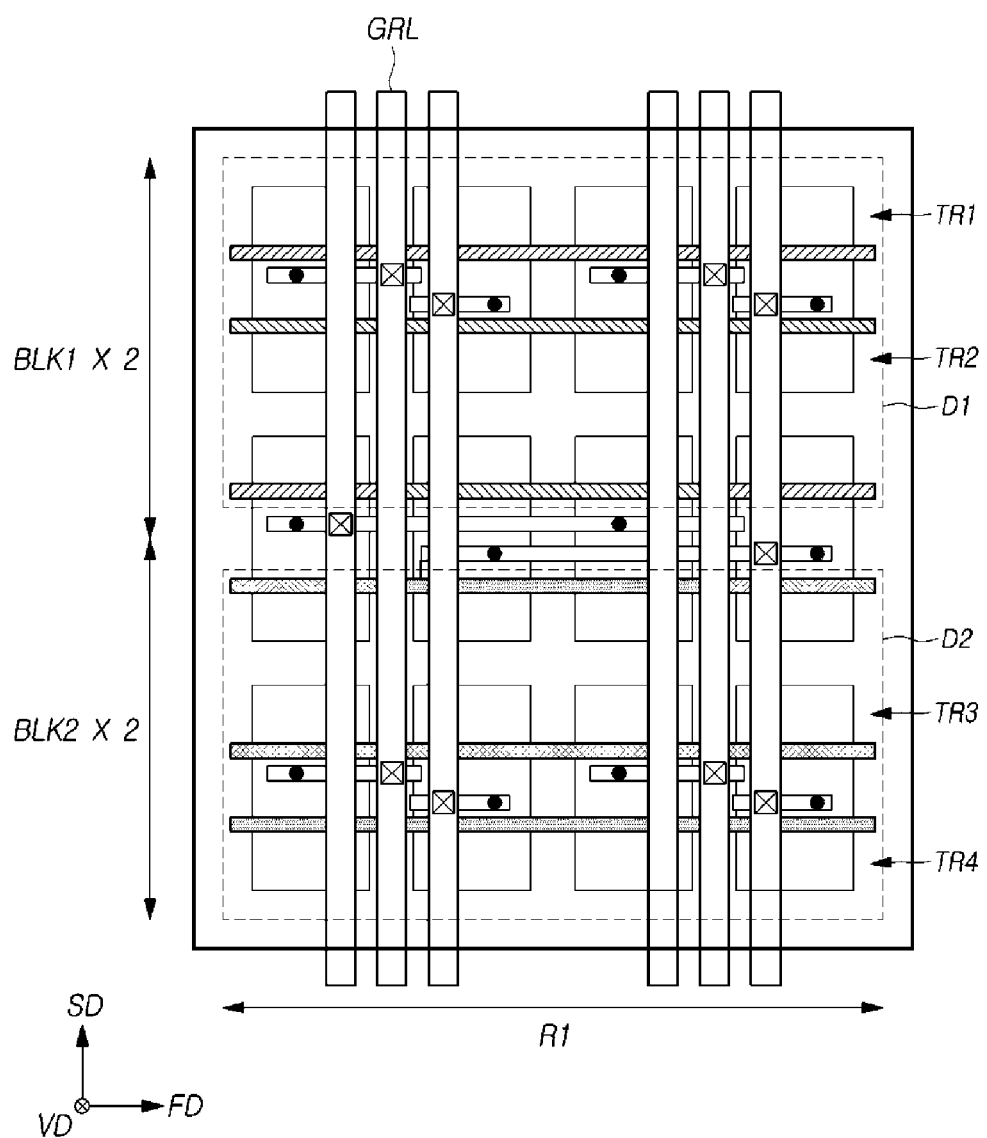
FIG. 10 is a view illustrating global row lines coupled to pass transistors of a first region of FIG. 9.
Figure 11:
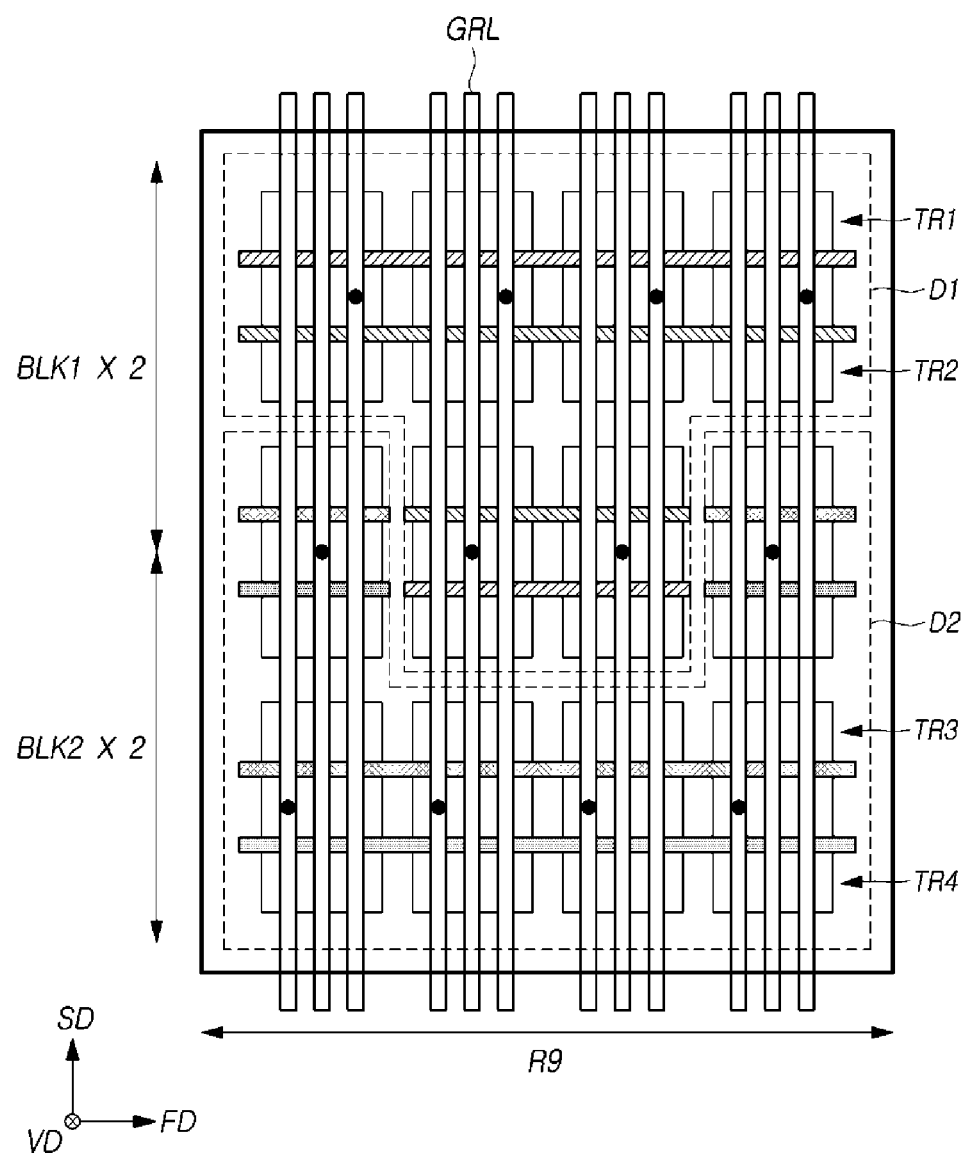
FIG. 11 is a view illustrating one example of global row lines coupled to pass transistors of a ninth region of FIG. 9.
Figure 12:
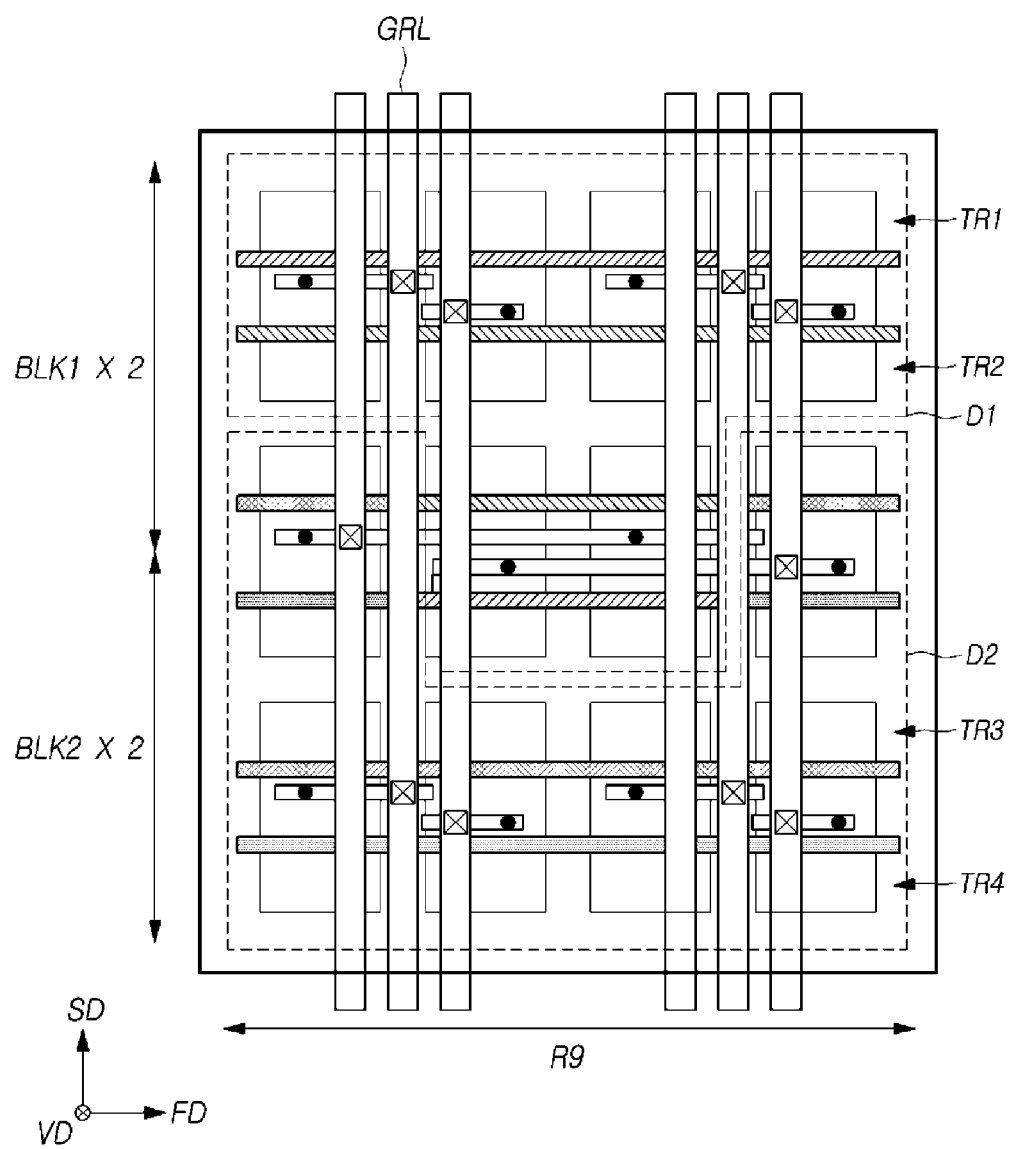
FIG. 12 is a view illustrating another example of global row lines coupled to pass transistors of the ninth region of FIG. 9.

FIG. 10 is a view illustrating global row lines coupled to pass transistors of a first region of FIG. 9, FIG. 11 is a view illustrating one example of global row lines coupled to pass transistors of a ninth region of FIG. 9, FIG. 12 is a view illustrating another example of global row lines coupled to pass transistors of the ninth region of FIG. 9, and FIG. 13 is a mapping table showing a coupling relationship between the global row lines of FIG. 12 and row lines of first and second memory blocks.

In FIG. 13, the number of a row line RL means the stack order of the corresponding row line RL. In addition, a row line RL of the first memory block BLK1 and a row line RL of the second memory block BLK2 written in the same row have the same page number and are coupled in common to a global row line GRL written in the same row.

As described above with reference to FIG. 9, in the first region R1, the two pass transistors TR1 and TR2 coupled to the two first memory blocks BLK1 included in the first electrode structure ES1 and the two pass transistors TR3 and TR4 coupled to the two second memory blocks BLK2 included in the second electrode structure ES2 may share one global row line GRL. As a result, the number of global row lines GRL may be ¼ of the number of pass transistors TR. FIG. 10 illustrates 24 pass transistors TR and 6 global row lines GRL. Although not illustrated, similarly in the first region R1, the number of global row lines GRL in the tenth region R10 (see FIG. 9) may be configured to be ¼ of the number of pass transistors TR.

As described above with reference to FIG. 9, in the ninth region R9, the pass transistors TR1 and TR2 coupled to the first memory blocks BLK1 of the first electrode structure ES1 and the pass transistors TR3 and TR4 coupled to the second memory blocks BLK2 of the second electrode structure ES2 do not share a global row line GRL. In this case, the number of global row lines GRL corresponds to half the number of pass transistors TR. FIG. 11 illustrates 24 pass transistors TR and 12 global row lines GRL. Although not illustrated, as in the ninth region R9, in each of the second to fourth regions R2 to R4 (see FIG. 9) and in each of the seventh and eighth regions R7 and R8 (see FIG. 9), the number of global row lines GRL may be configured to be half the number of pass transistors TR.

Referring to FIGS. 12 and 13, a method of assigning page numbers may be changed such that the electrode layers 20 of the first electrode structure ES1 and the electrode layers 20 of the second electrode structure ES2, whose pad regions are exposed by a first slimming hole and a second slimming hole disposed in a single region, are paired with each other one by one to have the same page numbers. For example, the same page number may be assigned to one of the electrode layers 20 of the first electrode structure ES1 (see FIG. 4) whose pad regions are exposed by the first slimming hole H1-5 (see FIG. 4) of the ninth region R9 and assigned to one of the electrode layers 20 of the second electrode structure ES2 (see FIG. 5) whose pad regions are exposed by the second slimming region H2-2 (see FIG. 5) of the ninth region R9. As a result, an electrode layer 20 of the first electrode structure ES1 and an electrode layer 20 of the second electrode structure ES2 that have the same stack order may have different page numbers.

When a page number assignment method is changed in this way, as illustrated in FIGS. 12 and 13, the two pass transistors TR1 and TR2 coupled to the two first memory blocks BLK1 included in the first electrode structure ES1 and the two pass transistors TR3 and TR4 coupled to the two second memory blocks BLK2 included in the second electrode structure ES2 may share one global row line GRL, and thus, the number of global row lines GRL may be configured to be ¼ of the number of pass transistors TR. FIG. 12 illustrates 24 pass transistors TR and 6 global row lines GRL. Although not illustrated, as in the ninth region R9, in each of the second to fourth regions R2 to R4 (see FIG. 9) and in each of the seventh and eighth regions R7 and R8 (see FIG. 9), the number of global row lines GRL may be configured to be ¼ of the number of pass transistors TR.

FIGS. 14A to 14F are cross-sectional views illustrating, by process steps, a three-dimensional memory device in accordance with an embodiment of the present disclosure.

Figure 14A:
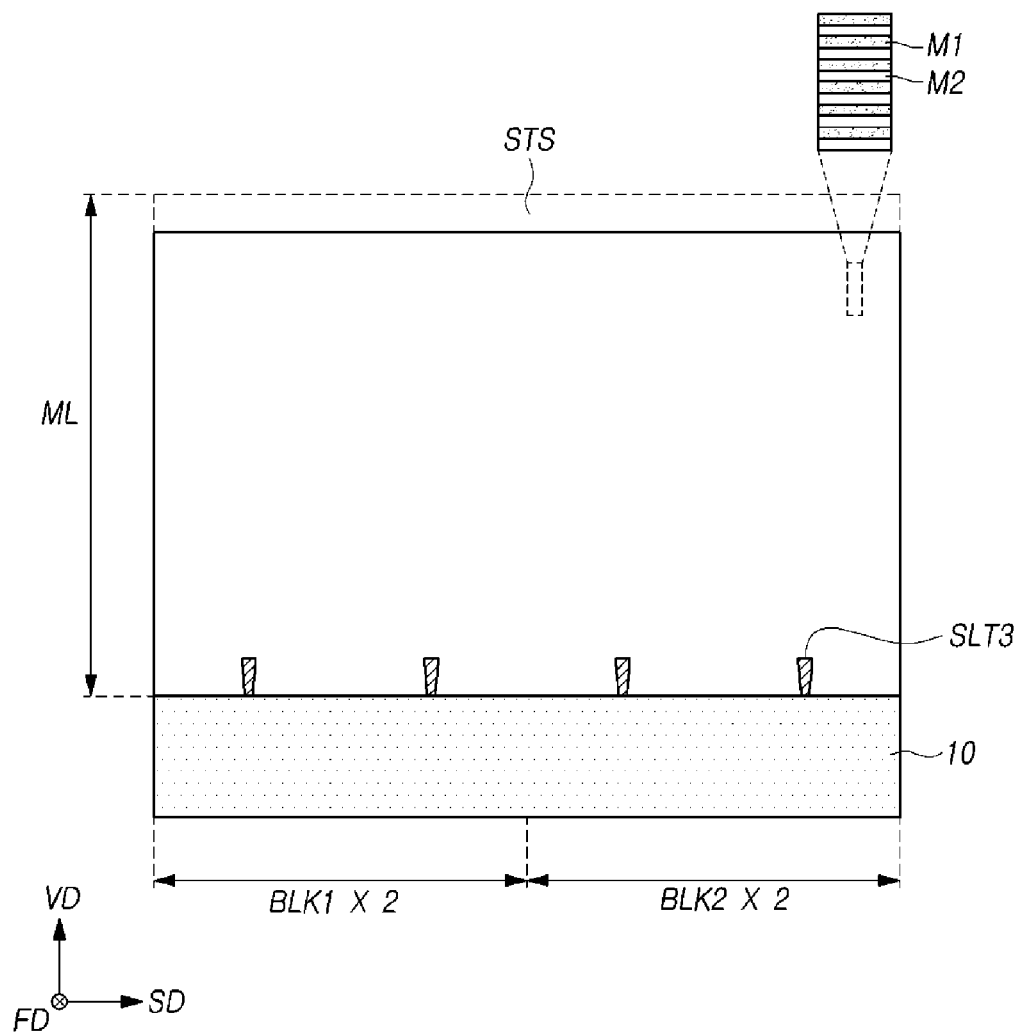
FIGS. 14A to 14F are cross-sectional views illustrating, by process steps, a three-dimensional memory device in accordance with an embodiment of the present disclosure.

Referring to FIG. 14A, a multi-layered stack ML is formed by alternately stacking a plurality of first material layers M1 and a plurality of second material layers M2 on a source plate 10. In an embodiment, the first material layers M1 may include sacrificial layers, and the second material layers M2 may include interlayer dielectric layers. The first material layers M1 may be formed of a dielectric material that has a different etching selectivity from the second material layers M2. For example, the first material layers M1 may be formed of silicon nitride, and the second material layers M2 may be formed of silicon oxide.

A plurality of step-shaped slits STS are formed in the multi-layered stack ML by an X-slim process. Although not illustrated in detail, each step-shaped slit STS may include a pair of step structures that extend in the second direction SD and face each other in the first direction FD. The plurality of step-shaped slits STS may be formed in the first to tenth regions R1 to R10, respectively, as illustrated in FIGS. 3 through 6.

The X-slim process may include a process of forming a mask pattern having a line-shaped opening extending in the second direction SD, an etching process of etching a portion exposed by the opening to a thickness corresponding to the vertical pitch of the first material layers M1, a slimming process of widening the width of the opening by reducing the width of the mask pattern, and a process of alternately repeating the etching process and the slimming process. The vertical pitch of the first material layers M1 means the vertical distance between the top surfaces of two first material layers M1 that are adjacent to each other in the vertical direction VD. In FIG. 14A, reference symbol SLT3 denotes slits which divide a source select line.

Figure 14B:
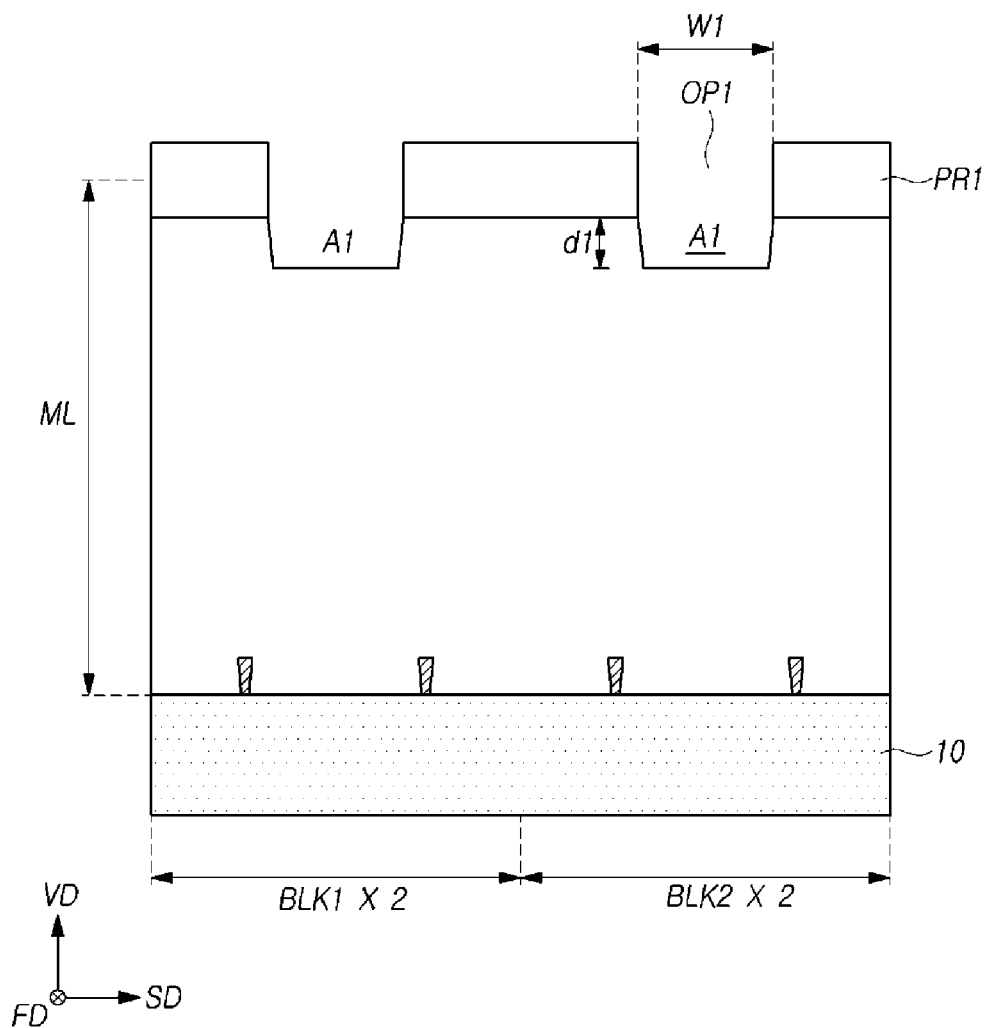

Referring to FIG. 14B, a first mask pattern PR1 having a hole-shaped first opening OP1 is formed on the multi-layered stack ML, and the multi-layered stack ML is etched by a first depth d1 by a first Z-slim process using the first mask pattern PR1 as an etch mask, thereby forming a first slimming hole A1. The first depth d1 may correspond to k (k is an integer equal to or greater than 2) times the vertical pitch of the first material layers M1.

The first mask pattern PR1 may be formed of a photoresist, and the first mask pattern PR1 remaining after the first Z-slim process may be removed through a strip process.

Figure 14C:
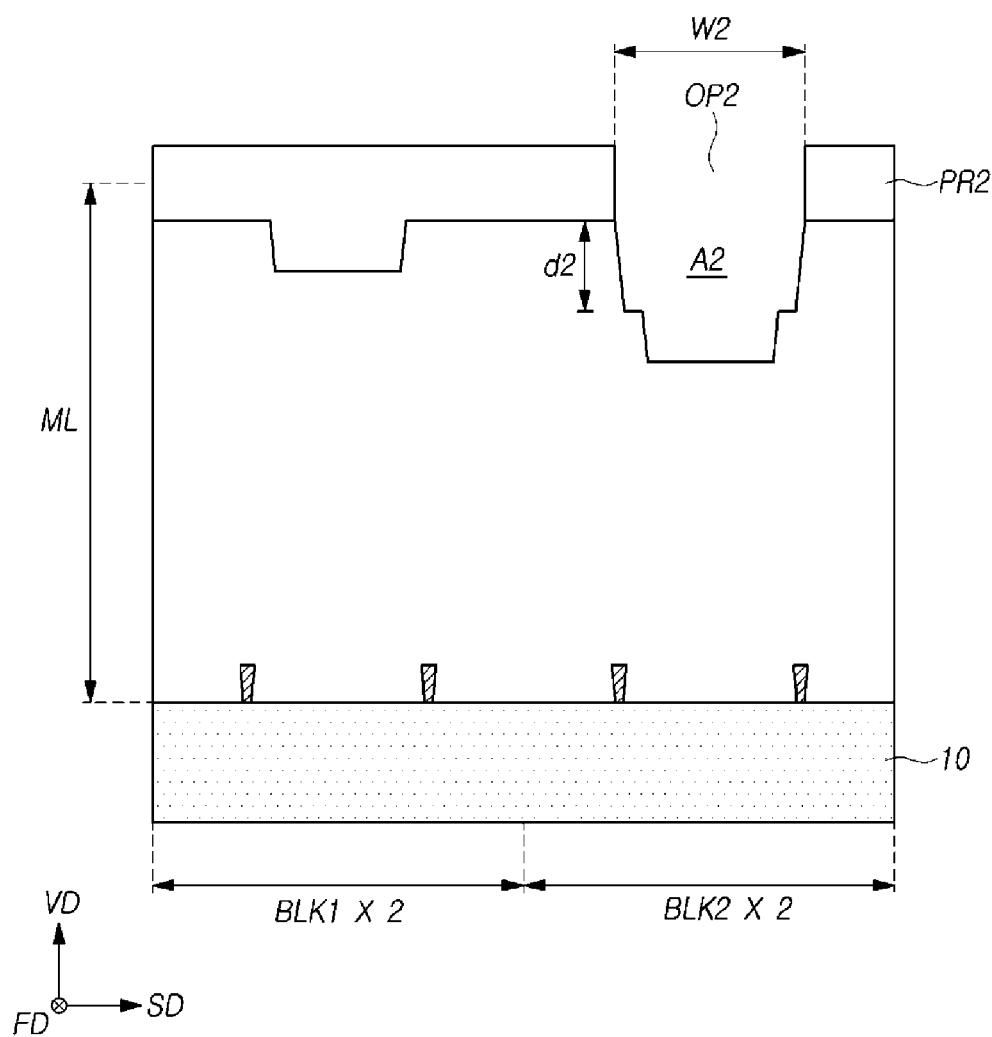

Referring to FIG. 14C, a second mask pattern PR2 having a hole-shaped second opening OP2 is formed on the multi-layered stack ML. For the overlay with the first slimming hole A1 (see FIG. 14B), the second opening OP2 may be configured to have a dimension larger by at least a predetermined size than the first slimming hole A1. For example, when the dimension of the first slimming hole A1 is W1, the dimension of the second opening OP2 may be configured to have a size of W2, which is larger than W1.

The multi-layered stack ML is etched by a second depth d2 by a second Z-slim process using the second mask pattern PR2 as an etch mask, thereby forming a second slimming hole A2. The second depth d2 may correspond to m (m is an integer equal to or greater than 2) times the vertical pitch of the first material layers M1.

The second mask pattern PR2 may be formed of a photoresist, and the second mask pattern PR2 remaining after the second Z-slim process may be removed through a strip process.

Figure 14D:
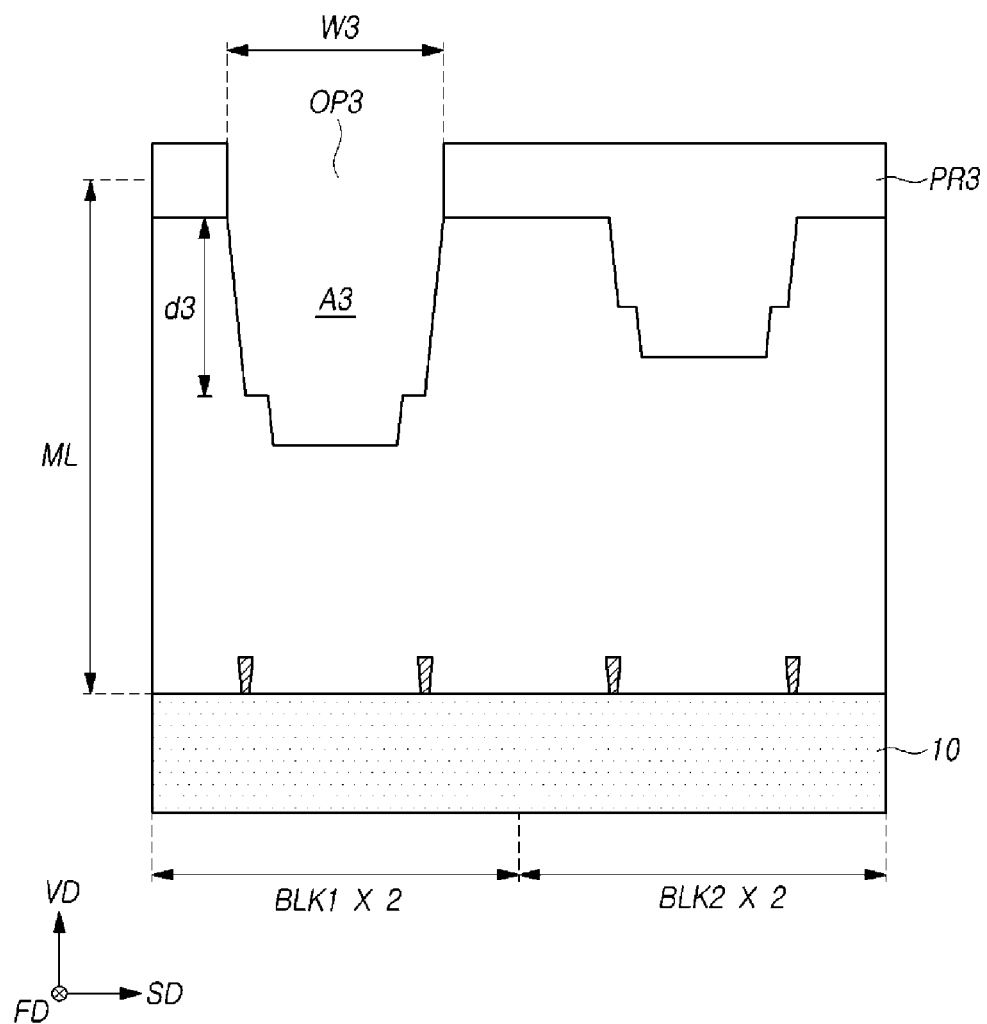

Referring to FIG. 14D, a third mask pattern PR3 having a hole-shaped third opening OP3 is formed on the multi-layered stack ML. For the overlay with the first slimming hole A1 (see FIG. 14B), the third opening OP3 may be configured to have a dimension larger by at least a predetermined size than the first slimming hole A1. For example, when the dimension of the first slimming hole A1 is W1, the dimension of the third opening OP3 may be configured to have a size of W3, which is larger than W1.

The multi-layered stack ML is etched by a third depth d3 by a third Z-slim process using the third mask pattern PR3 as an etch mask, thereby forming a third slimming hole A3. The third depth d3 may correspond to n (n is an integer equal to or greater than 2) times the vertical pitch of the first material layers M1.

The third mask pattern PR3 may be formed of a photoresist, and the third mask pattern PR3 remaining after the third Z-slim process may be removed through a strip process.

Figure 14E:
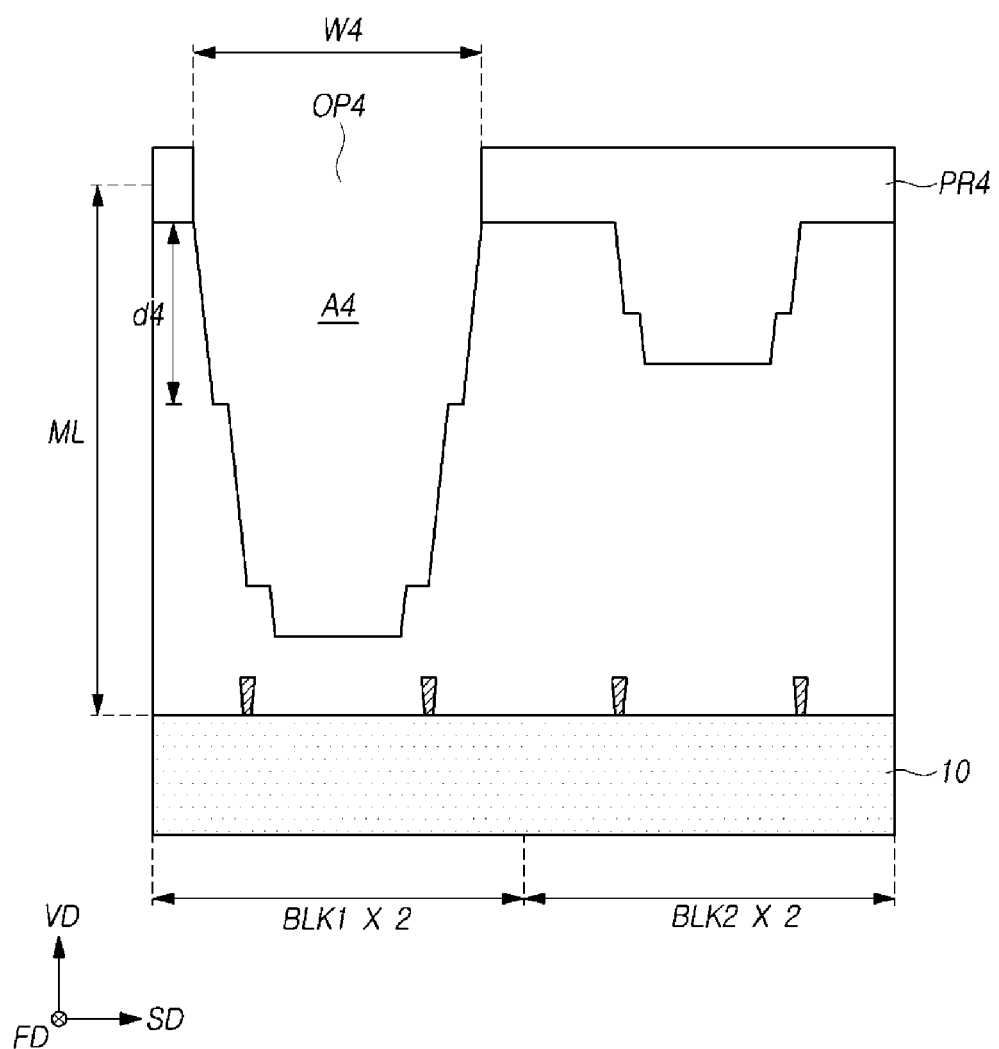

Referring to FIG. 14E, a fourth mask pattern PR4 having a hole-shaped fourth opening OP4 is formed on the multi-layered stack ML. For the overlay with the third slimming hole A3 (see FIG. 14D), the fourth opening OP4 may be configured to have a dimension larger by at least a predetermined size than the third slimming hole A3. For example, when the dimension of the third slimming hole A3 is W3, the dimension of the fourth opening OP4 may be configured to have a size of W4, which is larger than W3.

The multi-layered stack ML is etched by a fourth depth d4 by a fourth Z-slim process using the fourth mask pattern PR4 as an etch mask, thereby forming a fourth slimming hole A4. The fourth depth d4 may correspond to t (t is an integer equal to or greater than 2) times the vertical pitch of the first material layers M1.

The fourth mask pattern PR4 may be formed of a photoresist, and the fourth mask pattern PR4 remaining after the fourth Z-slim process may be removed through a strip process.

Figure 14F:
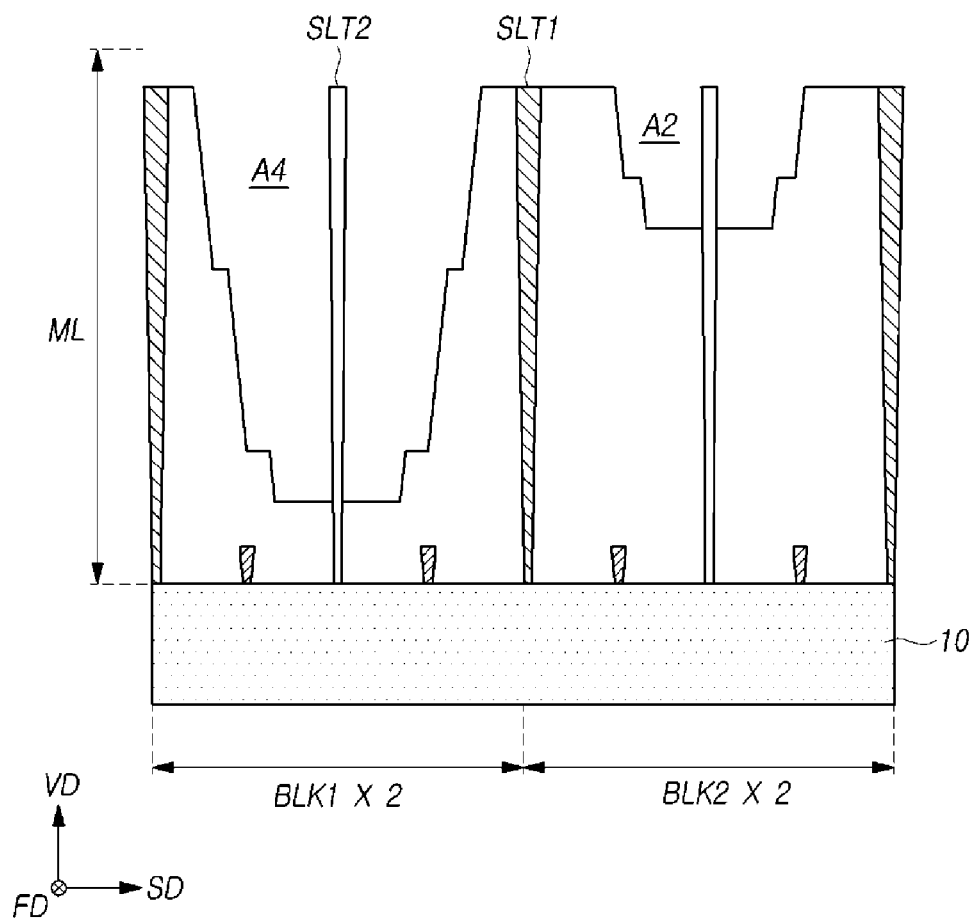

Referring to FIG. 14F, first slits SLT1, which divide the multi-layered stack ML into units of electrode structures, and second slits SLT2, which divide the multi-layered stack ML into units of memory blocks, are formed, and, after removing the first material layers M1 (see FIG. 14A) of the multi-layered stack ML by injecting an etchant through the first slits SLT1 and the second slits SLT2, electrode layers are formed by filling an electrode material in a space from which the first material layers M1 are removed.

Due to an etch loading during a Z-slim process, a slimming hole has a tapered shape whose width gradually decreases toward the bottom. Therefore, in order to prevent a not-open failure, as the depth of the slimming hole increases, the dimension of the entrance of the slimming hole should be formed to be larger. In addition, as described above, for an overlay with a slimming hole formed in a previous process, the dimension of the opening of a mask pattern used in the Z-slim process should be increased to be larger than the dimension of the slimming hole formed in the previous process. Thus, as the number of repetition times of the Z-slim process increases, the dimension of the entrance of the slimming hole will increase.

When slimming holes that are adjacent to each other in the second direction SD are configured to have the same depth, the deeper slimming holes become adjacent to each other in the second direction SD, and thus, a failure may occur, in which the electrode layers 20 are cut by the slimming holes. By increasing the width of a memory block in the second direction SD, it is possible to prevent a failure due to the manner in which the electrode layers 20 are cut. However, in this case, the size of the memory block increases. Therefore, where it is necessary to change the contents of only a portion of the memory block, additional and unnecessary erasures are performed for another portion of the memory block, and accordingly, the performance of the memory device may deteriorate and the lifespan of the memory device may be shortened.

As illustrated in FIG. 14F, according to embodiments of the present disclosure, by forming slimming holes, which are adjacent in the second direction SD, at different depths, a deeper slimming hole may be adjacent to a shallower slimming hole in the second direction SD. Thus, without causing a failure in which electrode layers are cut by slimming holes, it is possible to reduce the size of a memory block. Accordingly, by reducing unnecessary erasure, it is possible to improve the performance of the memory device and increase the lifespan of the memory device.

Figure 15:
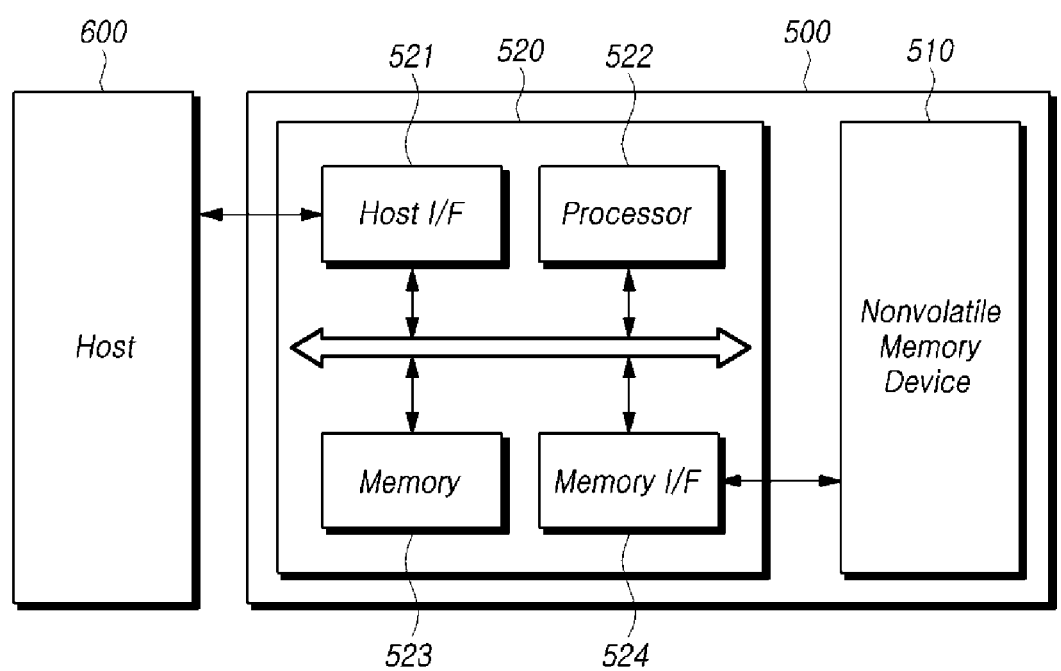
FIG. 15 is a block diagram schematically illustrating a memory system including a three-dimensional memory device in accordance with embodiments of the present disclosure.

FIG. 15 is a block diagram schematically illustrating a memory system including a three-dimensional memory device in accordance with an embodiment of the present disclosure.

Referring to FIG. 15, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 15 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the three-dimensional memory according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface Host I/F 521, a processor 522, the memory 523 and a memory interface Memory I/F 524. Although not illustrated in FIG. 15, the controller 520 may further include an ECC (error correction code) engine, which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 16:
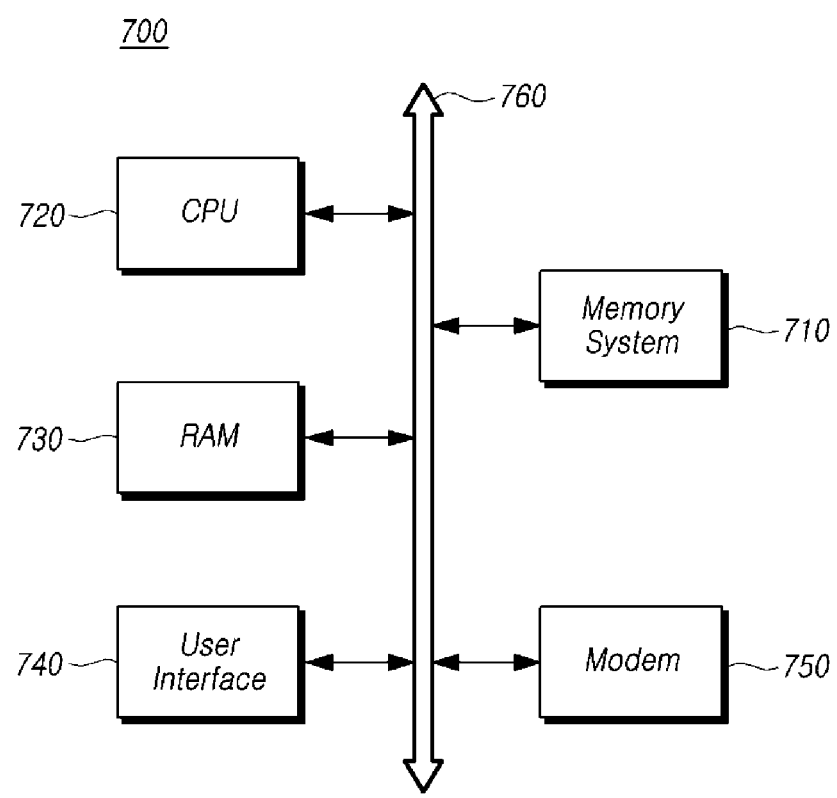
FIG. 16 is a block diagram schematically illustrating a computing system including a three-dimensional memory device in accordance with embodiments of the present disclosure.

FIG. 16 is a block diagram schematically illustrating a computing system including a three-dimensional memory device in accordance with embodiments of the disclosure.

Referring to FIG. 16, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A three-dimensional memory device comprising:
a first electrode structure and a second electrode structure, each extending in a first direction and being adjacent to each other in a second direction intersecting with the first direction, and each including a plurality of electrode layers and a plurality of interlayer dielectric layers that are alternately stacked on a source plate;
a plurality of first slimming holes arranged in the first direction and formed in the first electrode structure to expose pad regions of the electrode layers of the first electrode structure; and
a plurality of second slimming holes arranged in the first direction and formed in the second electrode structure to expose pad regions of the electrode layers of the second electrode structure,
wherein a first slimming hole and a second slimming hole that are adjacent in the second direction have different depths.

2. The three-dimensional memory device according to claim 1, wherein,
in each of a plurality of regions arranged in the first direction, one first slimming hole and one second slimming hole are disposed to be adjacent to each other in the second direction,
the plurality of first slimming holes and the plurality of second slimming holes are ordered with numbers corresponding to their depths, and
a sum of depth indicator numbers of a first slimming hole and a second slimming hole that are adjacent in the second direction is the same in each of the plurality of regions.

3. The three-dimensional memory device according to claim 1, further comprising:
a slit separating the first electrode structure and the second electrode structure,
wherein one first slimming hole and one second slimming hole are disposed in each of a plurality of regions arranged in the first direction to be adjacent to each other in the second direction, and
wherein the slit is configured to have a bent shape such that, in a region in which a depth of the first slimming hole is deeper than a depth of the second slimming hole, a width of the first electrode structure in the second direction is larger than a width of the second electrode structure in the second direction, and in a region where a depth of the first slimming hole is shallower than a depth of the second slimming hole, a width of the first electrode structure in the second direction is smaller than a width of the second electrode structure in the second direction.

4. The three-dimensional memory device according to claim 1, wherein first slimming holes remaining after excluding a first slimming hole having a deepest depth from among the plurality of first slimming holes includes an upper step structure and a lower step structure that are disposed at different heights, and
wherein second slimming holes remaining after excluding a second slimming hole having a deepest depth from among the plurality of second slimming holes includes an upper step structure and a lower step structure that are disposed at different heights.

5. The three-dimensional memory device according to claim 4, further comprising:
a first step-shaped slit formed in the first electrode structure, and including a pair of first step structures that face each other in the first direction; and
a second step-shaped slit formed in the second electrode structure, and including a pair of second step structures that face each other in the first direction,
wherein the upper step structure of a first slimming hole having a shallowest depth is configured to overlap the first step structures in the first direction, and
wherein the upper step structure of a second slimming hole having a shallowest depth is configured to overlap the second step structures in the first direction.

6. The three-dimensional memory device according to claim 1, wherein two first slimming holes having a deepest depth from among the plurality of first slimming holes are configured to pass through a source select line of the first electrode structure, two second slimming holes having a deepest depth from among the plurality of second slimming holes are configured to pass through a source select line of the second electrode structure, the source select line of the first electrode structure is divided into units of strings by the two first slimming holes having the deepest depth and a pair of first slits that extend opposite to each other in the first direction from the two first slimming holes having the deepest depth, and the source select line of the second electrode structure is divided into units of strings by the two second slimming holes having the deepest depth and a pair of second slits that extend opposite to each other in the first direction from the two second slimming holes having the deepest depth.

7. The three-dimensional memory device according to claim 1, wherein one of the two first slimming holes having the deepest depth is disposed to be adjacent in the second direction to a second slimming hole having a shallowest depth from among the plurality of second slimming holes, and the other of the two first slimming holes is disposed not to be adjacent to the plurality of second slimming holes in the second direction, and one of the two second slimming holes having the deepest depth from among the plurality of second slimming holes is disposed to be adjacent in the second direction to a first slimming hole having a shallowest depth from among the plurality of first slimming holes, and the other of the two second slimming holes is disposed not to be adjacent to the plurality of first slimming holes in the second direction.

8. The three-dimensional memory device according to claim 7, further comprising:

a substrate disposed below the source plate; and a block switch circuit disposed on the substrate, wherein the other of the two first slimming holes having the deepest depth and the other of the two second slimming holes having the deepest depth are configured to overlap the block switch circuit in a vertical direction.

9. The three-dimensional memory device according to claim 7, wherein each of one of the two first slimming holes having the deepest depth and one of the two second slimming holes having the deepest depth is configured to include, on lower sidewalls thereof, a pair of symmetrical first step structures that face each other in the first direction, and each of the other of the two first slimming holes having the deepest depth and the other of the two second slimming holes having the deepest depth is configured to include, on lower sidewalls thereof, a pair of symmetrical second step structures that face each other in the first direction.

10. The three-dimensional memory device according to claim 9, wherein one of the pair of second step structures is configured to have a slope that is the same as the first step structures, and the other is configured to have a slope that is steeper than the first step structures.

11. The three-dimensional memory device according to claim 1, wherein each of the number of the first slimming holes and the number of the second slimming holes is an odd number.

12. The three-dimensional memory device according to claim 1, further comprising:

a substrate disposed below the source plate; and a plurality of pass transistors disposed on the substrate, wherein the plurality of pass transistors comprises:

a plurality of first pass transistors coupled to pad regions that are exposed by one first slimming hole; and a plurality of second pass transistors coupled to pad regions that are exposed by one second slimming hole adjacent to the one first slimming hole in the second direction, and wherein the plurality of first pass transistors and the plurality of second pass transistors are disposed to overlap, in the vertical direction, one region of the first and second electrode structures, in which the one first slimming hole and the one second slimming hole are positioned.

13. The three-dimensional memory device according to claim 12, wherein each of the plurality of pass transistors is any one of two pass transistors that share one active region, and the plurality of first pass transistors are configured as pairs that share one active region, and the plurality of second pass transistors are configured as pairs that share one active region.

14. The three-dimensional memory device according to claim 13, wherein the plurality of first pass transistors do not share a global row line with the plurality of second pass transistors.

15. The three-dimensional memory device according to claim 13, wherein two first pass transistors that share one active region and two second pass transistors that share one active region share one global row line, and electrode layers of the first electrode structure whose pad regions are exposed by the one first slimming hole and electrode layers of the second electrode structure whose pad regions are exposed by the one second slimming hole are paired, and each pair has the same page number.

16. A three-dimensional memory device comprising:

a first electrode structure and a second electrode structure adjacent to each other in a second direction intersecting with a first direction, each including a plurality of electrode layers and a plurality of interlayer dielectric layers that are alternately stacked on a source plate;

a first slimming hole formed in the first electrode structure; and a second slimming hole formed in the second electrode structure to be adjacent to the first slimming hole in the second direction and to have a depth different from that of the first slimming hole.

17. The three-dimensional memory device according to claim 16, further comprising:

a plurality of pass transistors disposed in a substrate below the source plate, and overlapping the first and second electrode structures in a vertical direction perpendicular to a top surface of the substrate, wherein each of the plurality of pass transistors is one of two pass transistors that share one active region, and wherein the two pass transistors that share the one active region are coupled in common to any one of the first slimming hole and the second slimming hole.

18. The three-dimensional memory device according to claim 17, wherein
the number of rows of active regions overlapping the first and second electrode structures in the vertical direction is an odd number equal to or greater than three, and
pass transistors that are coupled to the first slimming hole and pass transistors that are coupled to the second slimming hole share at least one row of active regions.

* * * * *